(12) United States Patent
Yamada et al.

(10) Patent No.: US 8,290,180 B2
(45) Date of Patent: Oct. 16, 2012

(54) SIGNAL PROCESSING DEVICE, SIGNAL PROCESSING METHOD, AND PROGRAM THEREFOR

(75) Inventors: Yuji Yamada, Tokyo (JP); Koyuru Okimoto, Tokyo (JP)

(73) Assignee: Sony Corporation, Tokyo (JP)

( * ) Notice: Subject to any disclaimer, the term of this patent is extended or adjusted under 35 U.S.C. 154(b) by 1041 days.

(21) Appl. No.: 12/229,015

(22) Filed: Aug. 19, 2008

(65) Prior Publication Data

US 2009/0052695 A1    Feb. 26, 2009

(30) Foreign Application Priority Data

Aug. 23, 2007    (JP) .................................. 2007-216983

(51) Int. Cl.
*H03G 5/00* (2006.01)
*G10L 5/06* (2006.01)

(52) U.S. Cl. .......................................... 381/98; 704/226
(58) Field of Classification Search .................... 381/58, 381/61, 97–98; 704/94, 226
See application file for complete search history.

(56) References Cited

U.S. PATENT DOCUMENTS

| | | | |
|---|---|---|---|
| 5,651,092 A * | 7/1997 | Ishii et al. ...................... | 704/226 |
| 5,778,067 A | 7/1998 | Jones | |
| 7,269,445 B2 | 9/2007 | Natsuno et al. | |
| 8,150,066 B2 * | 4/2012 | Kubo ............................. | 381/98 |
| 2004/0035930 A1 | 2/2004 | Arisawa | |
| 2005/0185802 A1 * | 8/2005 | Yoshida ......................... | 381/98 |
| 2008/0091416 A1 * | 4/2008 | Kim et al. .................. | 704/200.1 |
| 2009/0050686 A1 | 2/2009 | Kon et al. | |
| 2009/0050687 A1 | 2/2009 | Kon et al. | |
| 2009/0050688 A1 | 2/2009 | Kon et al. | |
| 2009/0050689 A1 | 2/2009 | Sako et al. | |

FOREIGN PATENT DOCUMENTS

| | | |
|---|---|---|
| FR | 2810435 A | 12/2001 |
| JP | 01-238298 A | 9/1989 |
| JP | 05-145992 A | 6/1993 |
| JP | 05-227588 A | 9/1993 |
| JP | 08-213862 A | 8/1996 |
| JP | 11-509712 | 8/1999 |
| JP | 2000-076399 A | 3/2000 |
| JP | 2000-123138 A | 4/2000 |
| JP | 2000-259901 A | 9/2000 |
| JP | 2002-197518 A | 7/2002 |
| JP | 2003-015695 A | 1/2003 |
| JP | 2003-187167 A | 7/2003 |
| JP | 2003-187173 A | 7/2003 |
| JP | 2004-192476 A | 7/2004 |
| JP | 2005-011044 A | 1/2005 |
| JP | 2005-242444 A | 9/2005 |
| JP | 2005-266879 A | 9/2005 |
| JP | 2005-318598 A | 11/2005 |

(Continued)

*Primary Examiner* — Calvin Lee
(74) *Attorney, Agent, or Firm* — Wolf, Greenfield & Sacks, P.C.

(57) ABSTRACT

A signal processing device includes a bass signal extractor, a harmonic wave generator, a level detector, and an adjustment controller. The bass signal extractor first extracts a bass signal from an input audio signal. Natural-sounding bass enhancement is achieved as a result of the adjustment controller boosting the bass signal level until the level detector detects the bass signal level at a set level. For input bass signal levels higher than the set level, bass is enhanced virtually using a harmonic signal generated from the bass signal by the harmonic wave generator. As a result, the disadvantages of the boost method and the virtual signal enhancement method are mutually compensated for, and synergistic advantages for bass enhancement are obtained.

9 Claims, 21 Drawing Sheets

FOREIGN PATENT DOCUMENTS

| | | |
|---|---|---|
| JP | 2006-155045 A | 6/2006 |
| JP | 2006-304052 A | 11/2006 |
| JP | 2006-318453 A | 11/2006 |
| JP | 2006-324786 A | 11/2006 |
| JP | 2006-222867 A | 8/2008 |
| WO | WO02-061572 A1 | 8/2002 |

* cited by examiner

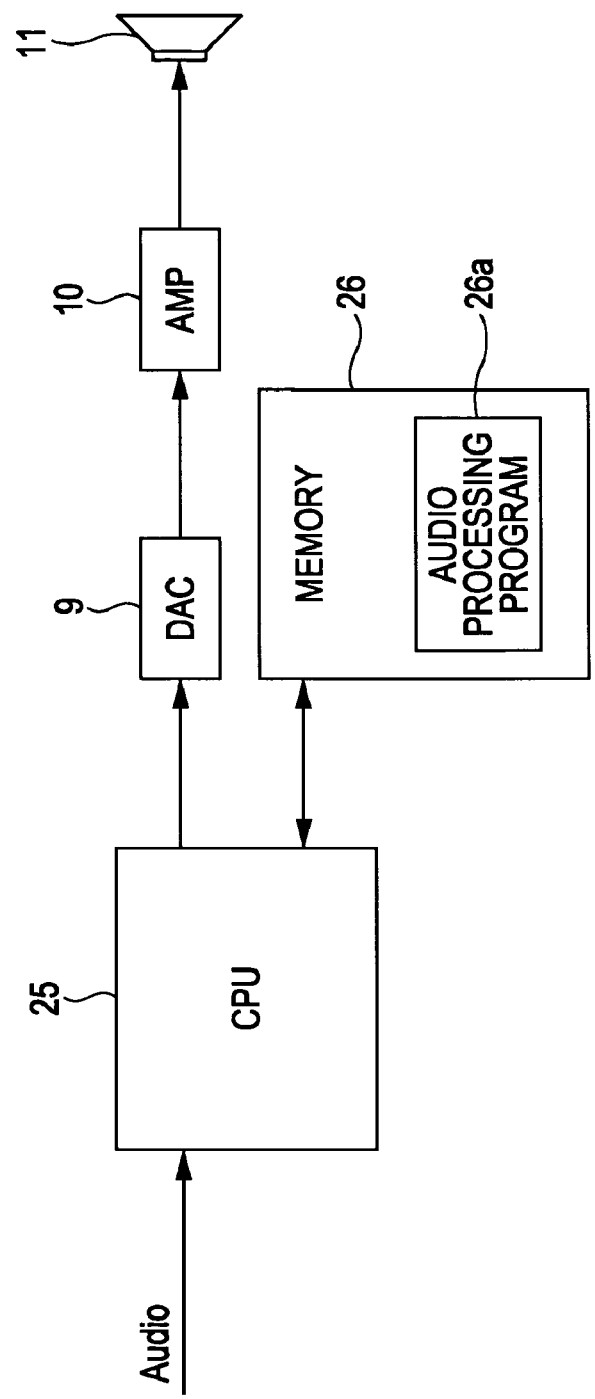

INPUT SIGNAL

OUTPUT SIGNAL

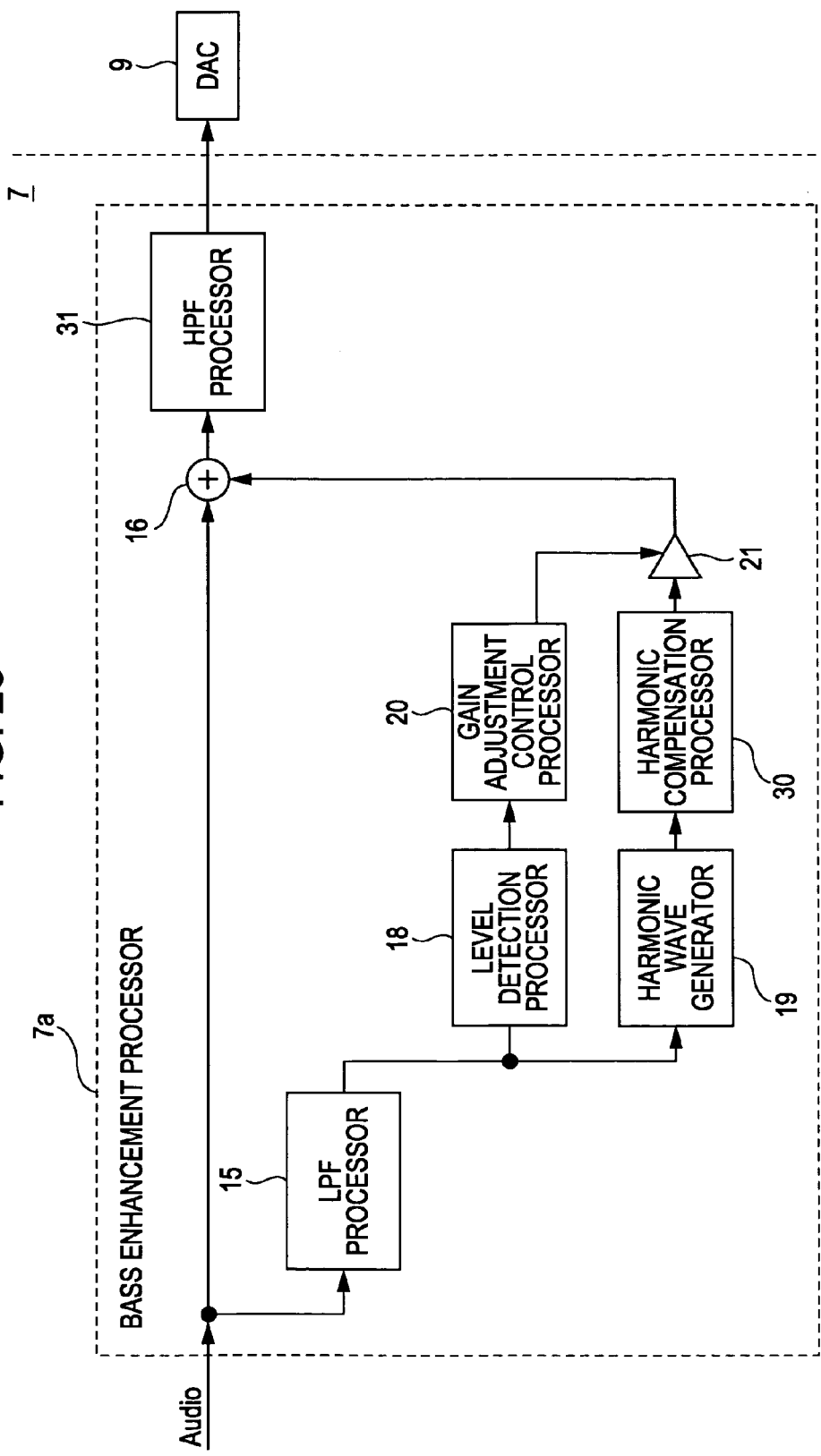

SIGNAL PROCESSING DEVICE, SIGNAL PROCESSING METHOD, AND PROGRAM THEREFOR

CROSS REFERENCES TO RELATED APPLICATIONS

The present invention contains subject matter related to Japanese Patent Application JP 2007-216983 filed in the Japanese Patent Office on Aug. 23, 2007, the entire contents of which are incorporated herein by reference.

BACKGROUND OF THE INVENTION

1. Field of the Invention

The present invention relates to a signal processing device that processes an input audio signal, as well as a method and program therefor.

2. Description of the Related Art

When conducting sound reproduction using a speaker on the basis of an audio signal, it is known that in sound reproduction using a small speaker, for example, ample bass reproduction cannot be realized due to limitations imposed by the physical volume of the speaker.

FIG. 25 shows a comparison between the frequency characteristics (i.e., frequency-amplitude characteristics) of a large speaker and a small speaker. In the case of the large speaker indicated in FIG. 25A, amplitude drop at the lower frequency bound of the figure (50 Hz) cannot be seen, while in the case of the small speaker indicated in FIG. 25B, it can be seen that the amplitude is dropping at frequencies below 200 Hz.

Various methods for improving the reproduced sound of bass components with small speakers have been proposed for some time. One of these involves boosting the bass component. Typically, bass component signals are not completely absent from playback, even with small speakers. Consequently, reproduced sound can be obtained at attenuated volumes compared to those of a large speaker, as shown in FIG. 25B. Thus, by raising the gain to boost the bass component, reproduced sound can be obtained that extends to the bass region.

In addition, another technique is known wherein harmonic waves of the bass signal are added. More specifically, the bass component of an audio signal is extracted and processing to generate harmonic waves is performed thereon (using full-wave rectification, for example). In so doing, a harmonic signal of the bass component is generated. Subsequently, the harmonic signal is added to the audio signal. By conducting such processing, the presence of the harmonic waves causes the listener to perceive that a bass signal is present, even if the bass signal is not actually reproduced. This phenomenon is typically known as the "missing fundamental".

Japanese Unexamined Patent Application Publication (Translation of PCT Application) No. H11-509712 discloses background art related to the above.

SUMMARY OF THE INVENTION

By adopting techniques such as the above, it is possible to increase the richness and depth of bass tones, even with a compact speaker system. However, when the technique of boosting the bass signal is adopted from among the above, non-linear distortion becomes a problem. More specifically, when the signal level input into the speaker exceeds a set tolerance value, bass fullness cannot be increased further. Moreover, such input values lead to degraded sound quality. As long as the input level remains within the tolerance region of the speaker, increased bass fullness with favorable sound quality can be achieved.

Meanwhile, with the other technique of adding harmonic waves, the harmonic component generated on the basis of the bass component becomes the means by which bass is made to seem fuller. For this reason, the problem of non-linear distortion that is associated with bass playback when boosting the bass region can be avoided. However, since in this technique bass is made to seem fuller using what is ultimately a virtual signal, the sound quality is poor when compared to that of the bass boost technique.

The present invention, being devised in the light of problems such as the above, is configured as a signal processing device like the following.

Specifically, the signal processing device includes the following. A bass signal extractor extracts a low-frequency band signal from an input audio signal. A harmonic wave generator generates a harmonic signal from the low-frequency band signal that was extracted by the bass signal extractor. A level detector detects the level of the low-frequency band signal that was extracted by the bass signal extractor. Furthermore, an adjustment controller controls the adjustment of both the level of the low-frequency band signal extracted by the bass signal extractor as well as the level of the harmonic signal generated by the harmonic wave generator, the adjustment being conducted according to the level of the low-frequency band signal detected by the level detector.

As can be inferred from the above configuration, in the device of the present invention, a technique is adopted that combines both a boost method that boosts the bass signal, as well as a virtual signal enhancement method that attempts to enhance bass by applying a harmonic signal of the bass signal. Moreover, the device is configured to conduct an adjustment control that adjusts both the bass signal level (i.e., the amount of boost) as well as the harmonic signal level according to the detected level of the bass signal.

As described earlier, the boost method is able to enhance bass with a more natural-sounding quality compared to the virtual signal enhancement method. However, due to the problem of non-linear distortion, bass enhancement becomes difficult when the input signal level exceeds a set value, and moreover, degraded sound quality also becomes a problem in such a case. In contrast, the virtual signal enhancement method is able to avoid the problem of non-linear distortion associated with such bass reproduction. However, since bass enhancement is conducted using what is ultimately a virtual signal, output is poor with regards to the naturalness of the reproduced sound when compared to the boost method.

As a result of the present invention, an adjustment control is conducted to adjust both the amount of bass boost as well as the harmonic signal level. More specifically, as a result of the present invention, natural-sounding bass enhancement is conducted by increasing the amount of boost until the input bass signal level reaches a predetermined level, for example. When a bass signal is input whose level exceeds the predetermined level, bass is continued to be enhanced by using the virtual signal method.

In other words, as a result of the present invention, bass enhancement can be conducted wherein the disadvantages of the boost method and the virtual signal enhancement method are mutually compensated for, thereby allowing synergistic advantages to be obtained.

BRIEF DESCRIPTION OF THE DRAWINGS

FIG. 14 is a block diagram illustrating the internal configuration of an electronic equipment provided with a signal processing device in accordance with the second embodiment;

FIG. 23 is an explanatory diagram illustrating the configuration of a modification of the third embodiment;

DESCRIPTION OF THE PREFERRED EMBODIMENTS

Hereinafter, preferred embodiments of the invention will be described.

First Embodiment

Figure 1:
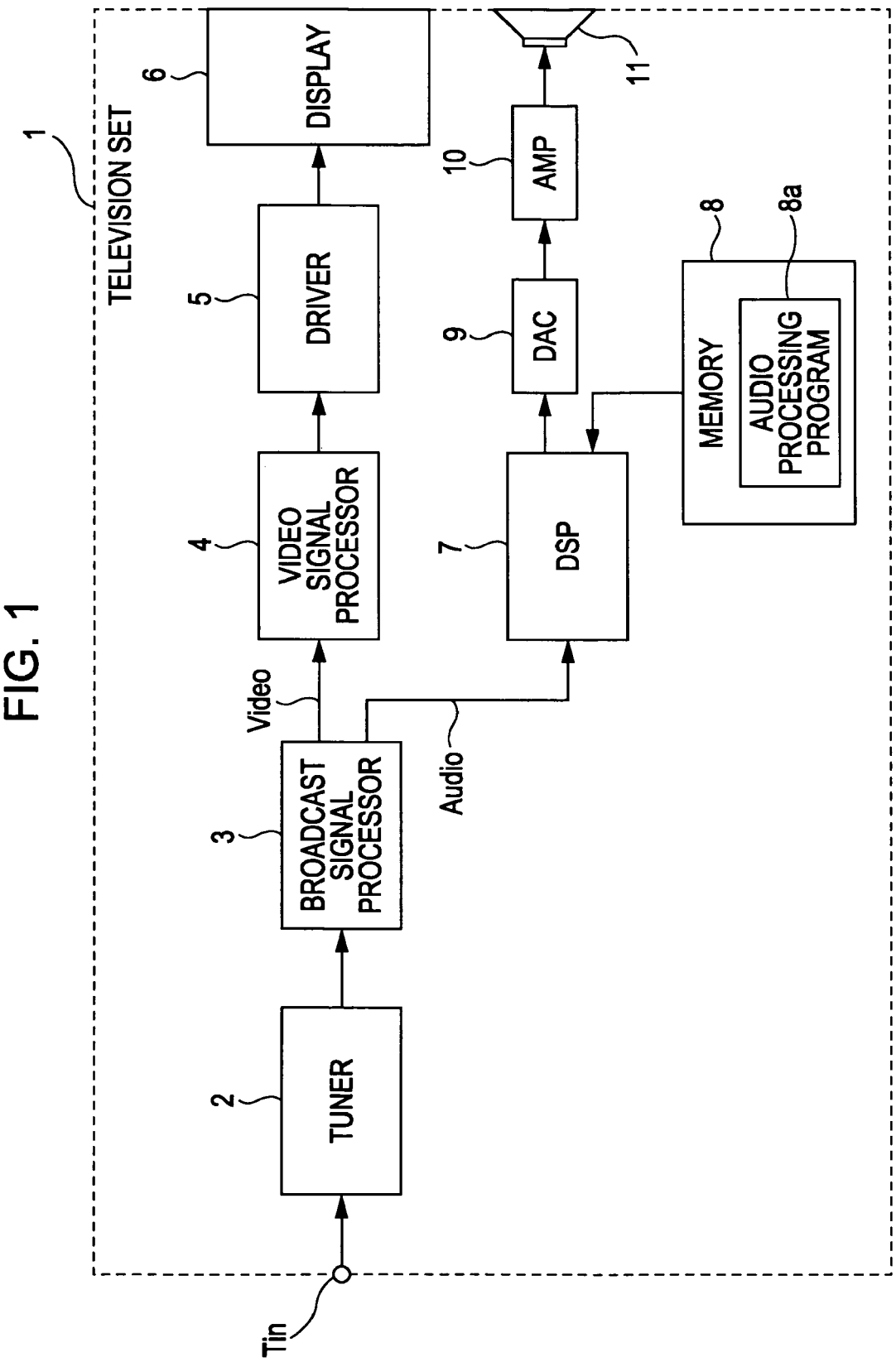
FIG. 1 is a block diagram illustrating the internal configuration of a television set provided with a signal processing device in accordance with the first embodiment of the present invention.

FIG. 1 is a block diagram illustrating the internal configuration of a television set 1, which acts as the signal processing device according to the first embodiment of the present invention.

The television set 1 receives digital television broadcasts, and according to the received signal, conducts image display and audio playback. First, a broadcast signal from a digital television broadcast is received using an antenna (not shown in the drawings), and then input into the television set 1 from the terminal Tin shown in the figure.

The received signal from the antenna is then input into a tuner 2 via the terminal Tin. The tuner 2 is configured to receive a carrier (i.e., a receiver frequency signal) that has been specified by a channel selection operation or similar means. The tuner 2 then performs Viterbi decoding and error correction processing, for example, and thereby obtains a TS (Transport Stream).

As is commonly known, a TS is defined by digital broadcasting standards, such as those of digital terrestrial broadcasting or digital satellite broadcasting. A TS is multiplexed with compressed data containing video signals and audio signals for a plurality of programs (i.e., television programs) and various additional information. The compressed data is compressed according to the MPEG-2 (Moving Picture Experts Group Layer 2) standard.

The compressed data containing the above video signals and audio signals are multiplexed as ESes (Elementary Streams). The additional information inserted by the broadcaster may include SI (Service Information) or PSI (Program Specific Information), which stores tables such as a PAT (Program Association Table) or PMT (Program Map Table). The multiplexing of each set of information is achieved by using 188-byte transport stream packets (TS packets) to form the TS, wherein the above ESes and sets of various additional information are stored in these TS packets.

Since the processing relating to the multiplexing of the various additional information into the above TS is well-known, further description thereof will be omitted herein. Configuration related to the processing of the compressed video signals and audio signals will now be described.

The TS, having been obtained by the tuner 2 as described above, is supplied to a broadcast signal processor 3. The broadcast signal processor 3 then descrambles and demultiplexes the TS. The compressed MPEG data obtained by demultiplexing is then decoded, and thus the broadcast content is obtained in the form of a video signal (i.e., a digital video signal; represented in the drawings as "Video") and an audio signal (i.e., a digital audio signal; represented in the drawings as "Audio"). The digital video signal obtained by the broadcast signal processor 3 is then supplied to a video signal processor 4, while the similarly obtained digital audio signal is supplied to a DSP (Digital Signal Processor) 7.

Using the above digital video signal, the video signal processor 4 conducts various video signal processing routines and detects the horizontal and vertical synchronization signals, for example, thereby generating a signal required to drive a display 6. A driver 5 controls the display 6 on the basis of the output signal from the video signal processor 4.

If the display 6 is taken to be an LCD (liquid-crystal display), for example, then the display 6 also includes a backlight together with an LCD panel. In this case, the driver 5 conducts both display control of the LCD panel as well as luminescence control of the backlight.

The DSP 7 is provided with memory 8. By conducting digital signal processing on the basis of an audio processing program 8a stored in the memory 8, audio signal processing is performed with respect to the above digital audio signal. The audio signal processing realized by the DSP 7 will be described later.

The digital audio signal obtained via the DSP 7 is then converted into an analog audio signal by a DAC (digital-to-analog converter), amplified by an amp 10, and finally supplied to a speaker 11. The speaker 11 then reproduces sound on the basis of the audio signal amplified by the amp 10.

Figure 2:
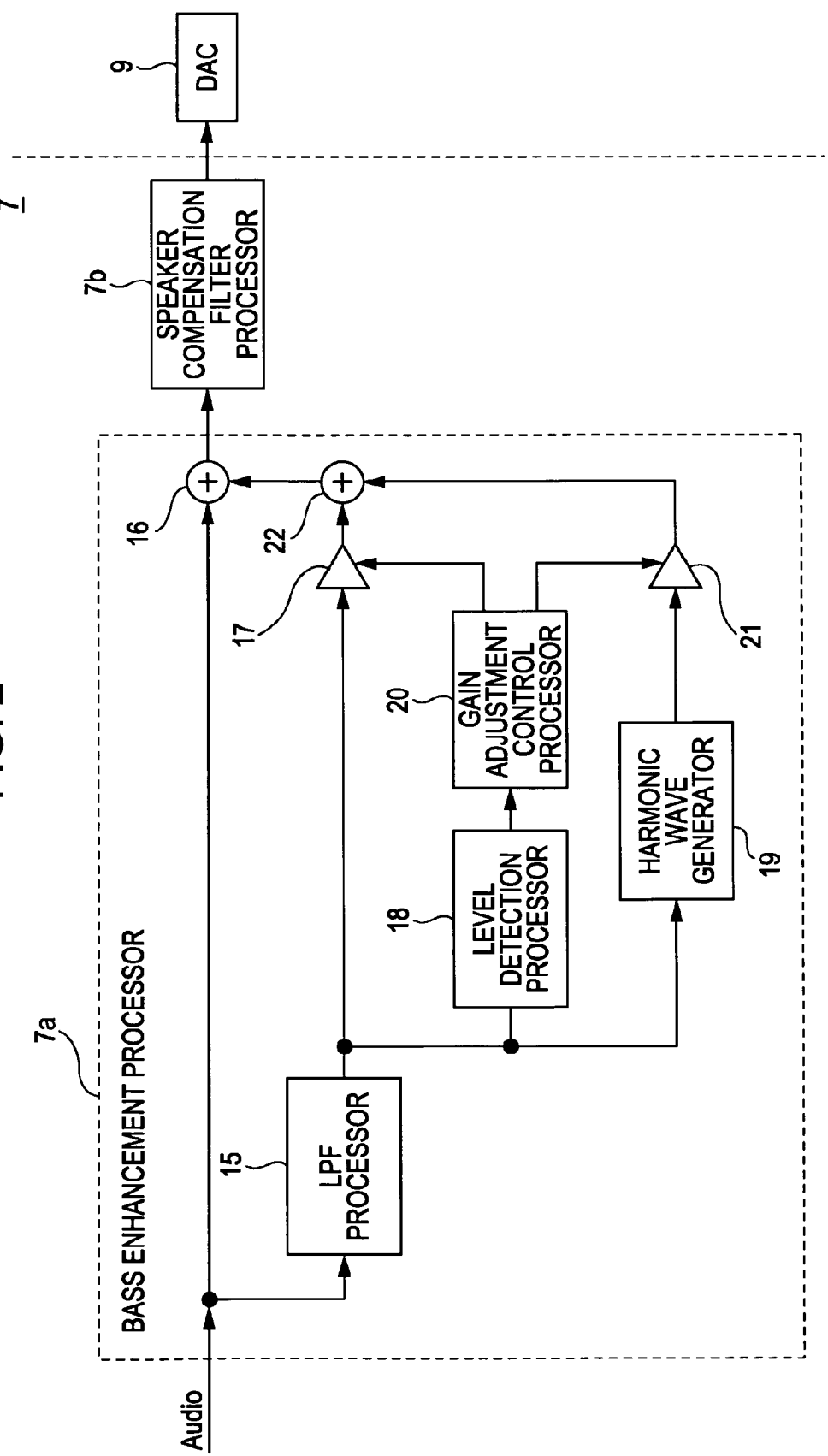
FIG. 2 is a block diagram schematically illustrating the various processing functions realized by a DSP provided in the television set shown in FIG. 1.

FIG. 2 is a block diagram schematically illustrating the various functional operations realized by the DSP 7 shown in FIG. 1. FIG. 2 also shows the DAC 9 shown in FIG. 1.

As shown in FIG. 2, the DSP 7 is programmed so as to conduct digital signal processing that realizes the functional operation of a bass enhancement processor 7a and an speaker compensation filter processor 7b.

First, the functions of the bass enhancement processor 7a will be described in more detail. As shown in FIG. 2, the bass enhancement processor 7a can be subdivided into a LPF (Low Pass Filter) processor 15, an adder 16, a gain adjustment processor 17, a level detection processor 18, a harmonic wave generator 19, a gain adjustment control processor 20, a gain adjustment processor 21, and an adder 22.

For the sake of convenience in the following description, the operation of the DSP 7 will be described by taking each functional processing block thereof to be a hardware component. However, it should be appreciated that the operation of these functional processing blocks is realized as a result of the DSP 7 conducting digital signal processing, using hardware resources, on the basis of the audio processing program 8a.

First, a digital audio signal output from the broadcast signal processor 3 shown in FIG. 1 (hereinafter simply referred to as an audio signal) is split and supplied to both the LPF processor 15 and the adder 16.

Figure 3:
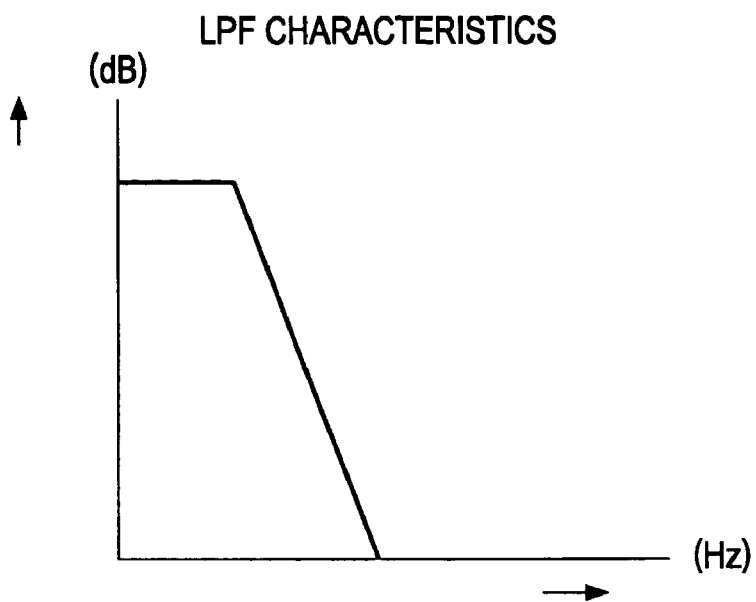
FIG. 3 illustrates exemplary LPF characteristics for generating a low-frequency band signal.

The LPF processor 15 conducts filter processing to extract a low-frequency band signal from the input audio signal. FIG. 3 illustrates the filter characteristics of the filter processing conducted by the LPF processor 15, the horizontal axis being frequency (Hz), and the vertical axis being gain (dB). As can be inferred from the figure, processing is conducted in the LPF processor 15 so as to extract only the frequency band of an input audio signal below a set frequency. More specifically, a fixed gain is applied from the lowest frequency up to a certain set frequency, and after that point, gain is damped. In so doing, a low-frequency band signal (hereinafter simply referred to as the bass signal or the bass component) of the audio signal is extracted.

In the case of the present embodiment, the cutoff frequency (i.e., the set frequency described above) in the LPF processor 15 is configured taking the low-frequency response of the speaker 11 into consideration. For example, the set frequency may be configured to be the upper-bound frequency of the frequency band for which the audio playback signal level of the speaker 11 is recognizably attenuated as compared to that of the input audio signal.

Figure 4:
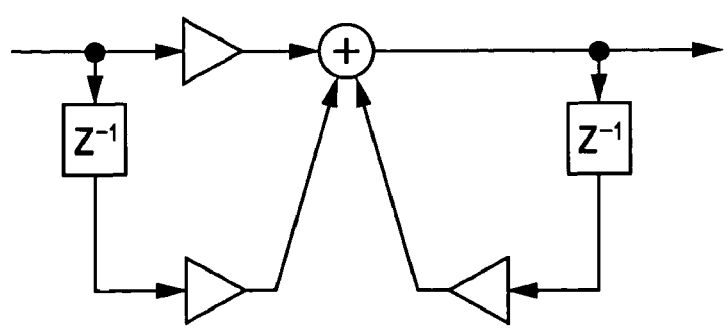
FIG. 4 illustrates an exemplary configuration of a digital filter for realizing LPF processing.

FIG. 4 illustrates the configuration of a digital filter for realizing filter characteristics like those shown in FIG. 3. As shown in FIG. 4, the filter characteristics in FIG. 3 can be realized using an IIR (Infinite Impulse Response) filter.

In the LPF processor 15, filter processing that results in characteristics like those shown in FIG. 3 is achieved by conducting digital filter processing that is able to perform the function expressed by the configuration of such an IIR filter.

Returning to FIG. 2, the low-frequency band signal, having been extracted from the audio signal by the LPF processor 15, is then respectively supplied to the gain adjustment processor 17, the level detection processor 18, and the harmonic wave generator 19.

The level detection processor 18 detects the absolute values of the signal levels of the bass signal obtained by the LPF processor 15. In addition, the harmonic wave generator 19 generates a harmonic signal from the bass signal obtained by the LPF processor 15.

Figure 5:
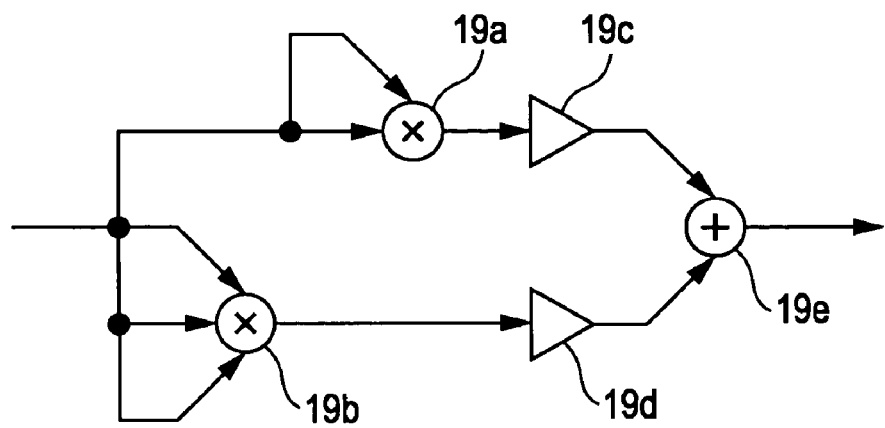
FIG. 5 illustrates an exemplary configuration of a digital computing unit for generating a harmonic signal.

FIG. 5 illustrates an exemplary configuration of a digital computing unit for realizing the harmonic wave generator 19.

Fundamentally, in order to generate an nth harmonic signal, a signal is input into the computing unit n times. In the example shown in the figure, the configuration for generating 2nd and 3rd harmonic waves is shown. More specifically, the computing unit is provided with a multiplier 19a, which is configured to multiply the input signal (in this case, the bass signal described above) two times, and a multiplier 19b, which is configured to multiply the input signal three times. Additionally provided are a gain adjuster 19c for adjusting the output level of the multiplier 19a, as well as a gain adjuster 19d for adjusting the output level of the multiplier 19b. Furthermore, the computing unit is configured such that the 2nd harmonic signal output via the gain adjuster 19c and the 3rd harmonic signal output via the gain adjuster 19d are added together at an adder 19e before being output.

Figure 6:
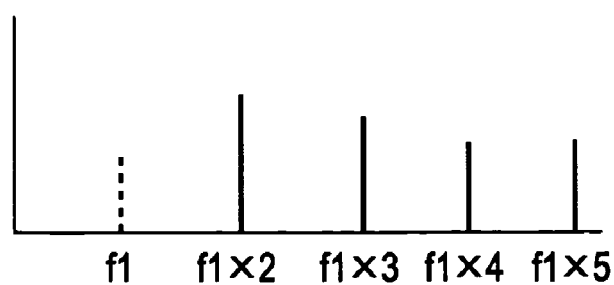
FIG. 6 is a conceptual drawing of harmonic wave.

FIG. 6 illustrates a conceptual rendering of a harmonic wave. FIG. 6 shows waves generated up to the 5th harmonic wave by way of example. The harmonic waves in this case are the harmonics of a frequency signal f1 that serves as a basis therefor (i.e., a source signal), wherein frequency signals f2, f3, f4, and f5 are generated therefrom, the generated frequency signals being two times, three times, four times, and five times the source signal f1, respectively.

Returning to FIG. 2, the harmonic signal generated by the harmonic wave generator 19 is then supplied to the gain adjustment processor 21. The harmonic signal passing through the gain adjustment processor 21 is then supplied to the adder 22, as shown in FIG. 2. At the adder 22, the harmonic signal is added to the bass signal obtained via the gain adjustment processor 17 described earlier.

Furthermore, the signal obtained in this way at the adder 22 by adding together gain-adjusted bass signal and the gain-adjusted harmonic signal (herein referred to as the first combined signal) is then supplied to the adder 16 described earlier. At the adder 16, the first combined signal is added to the input audio signal.

The result of the addition operation conducted by the adder 16 is taken to be the second combined signal, which is then supplied to the speaker compensation filter processor 7b described above. After passing through the speaker compensation filter processor 7b, the second combined signal is then supplied to the DAC 9 shown in FIG. 1 as the output signal of the DSP 7.

As can be inferred from the description heretofore, the audio signal processing of the present embodiment includes a subprocess to boot the bass signal (i.e., the process from the LPF processor 15 to the gain adjustment processor 17) as well as a subprocess to generate and output a harmonic signal on the basis of the bass signal (i.e., the process from the harmonic wave generator 19 to the gain adjustment processor 21).

Moreover, the present embodiment is configured so as to control the bass signal level and the harmonic signal level according to the detected level of the bass signal. More specifically, the present embodiment includes the level detection processor 18 and the gain adjustment control processor 20.

In FIG. 2, the gain adjustment control processor 20 controls the gain that the gain adjustment processor 17 and the gain adjustment processor 21 apply to their respective input signals, the gain control being conducted on the basis of the level detection results for the bass signal detected by the level detection processor 18.

In this case, the gain adjustment control processor 20 controls gain in the gain adjustment processor 17 such that the bass signal is boosted until the detected bass signal level reaches a certain threshold value. Additionally, the gain control is such that when the detected bass signal level exceeds the threshold value, bass signal boosting is not conducted, and instead, the output level of the bass signal is fixed regardless of the input level (i.e., the detected level).

Meanwhile, with regards to the harmonic wave signal, the gain adjustment control processor 20 controls gain in the gain adjustment processor 21 such that no signal is input (i.e., gain is set to 0) until the detected bass signal level reaches a certain threshold value. When the detected bass signal level exceeds the threshold value, a signal is output whose level is proportional to the input level.

Figure 7A:
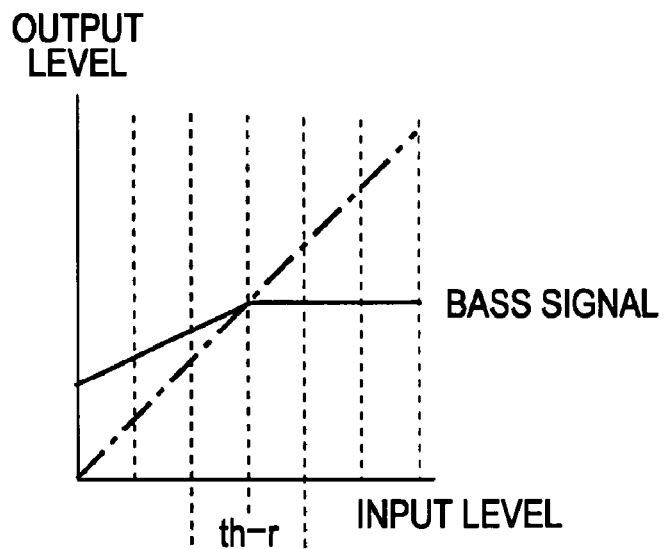
FIG. 7 shows exemplary gain adjustment control characteristics for a low-frequency band signal (i.e., a bass signal) and a harmonic signal.
Figure 7B:
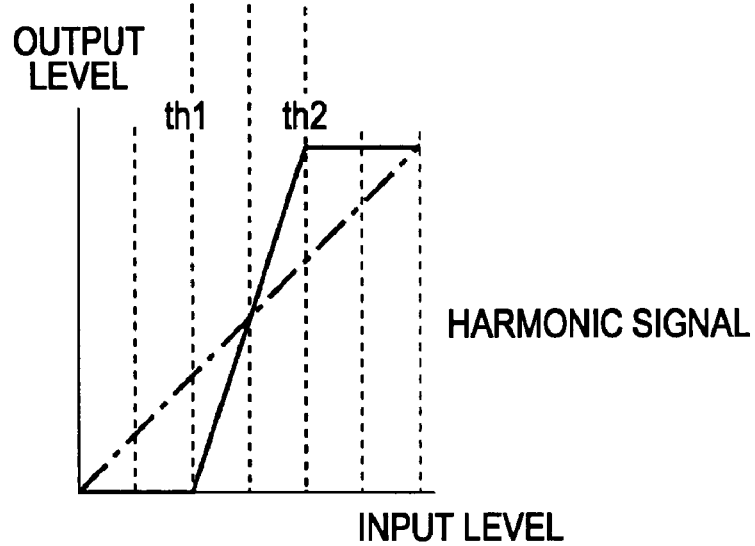

FIG. 7 is a diagram for describing an example of the gain adjustment control conducted by the gain adjustment control processor 20. FIG. 7A illustrates an example of the input/output level characteristics for the bass signal, while FIG. 7B illustrates an example of the input/output level characteristics for the harmonic signal. The "INPUT LEVEL" shown in the figure refers to the bass signal level detected by the level detection processor 18. The "OUTPUT LEVEL" refers to the level of the bass signal output via the gain adjustment processor 17 in the case of FIG. 7A, and the level of the harmonic signal output via the gain adjustment processor 21 in the case of FIG. 7B.

In both FIGS. 7A and 7B, the diagonal dashed line show linear characteristics, wherein the input level and the output level exist in a 1:1 ratio. In other words, this line represents a gain value of 1.

Accordingly, with respect to the bass signal in FIG. 7A, it can be seen gain control is configured such that a gain value greater than 1 is applied until a certain threshold value th-r is reached. When the input level reaches the threshold value th-r (i.e., when the input level equals the threshold value th-r), the gain value becomes 1.

Furthermore, in this case, the specific gain characteristics for the interval lasting until the input level reaches the threshold value th-r are such that the gain value becomes larger to the extent that the input level is low. In other words, it can be seen that the gain is configured to decrease as the input level increases.

Moreover, after the input level reaches the threshold value th-r (i.e., when the input level satisfies the condition of being greater than the threshold value th-r), the output level is configured to be a fixed level. In other words, gain is controlled so as to decrease as the input level increases, thereby maintaining the output level at a fixed level.

Meanwhile, with respect to the harmonic signal, gain is configured such that no signal is output (i.e., the output level equals 0) until the input level reaches a certain threshold value th1, as shown in FIG. 7B.

When the input level exceeds the threshold value th1, gain is controlled such that the output level rises proportionally to the rise in the input level, the gain control being conducted as long as the input level is within a range greater than the threshold value th1 and less than a threshold value th2. More specifically, in this case, gain is controlled such that the slope of the output level is fixed as the input level rises from the threshold value th1 to the threshold value th2. Furthermore, in this case, the threshold values th1 and th2 are configured so as to exist in a relationship with the threshold th-r described in FIG. 7A wherein (th1<th-r<th2), and wherein the gain becomes equal to 1 when the input level reaches the threshold value th-r. In other words, gain control is conducted such that once the output level of the bass signal becomes fixed as a result of the boost subprocess, the output level of the harmonic signal gradually rises as a result of gain values greater than 1.

In addition, as shown in FIG. 7B, when the input level becomes greater than the threshold value th2, gain is controlled such that the output level becomes fixed, regardless of further rises in the input level.

Thus, in the present example described above, the bass signal is boosted until the input level reaches a predetermined level, while the output level of the bass signal is suppressed to a fixed level in response to further rises in the input level above the predetermined level. In so doing, the bass signal is boosted only in the region where the speaker 11 does not exhibit non-linear distortion.

As can be inferred from the above, the specific output level of a bass signal when the threshold value th-r is reached should be configured such that the output level is suppressed to at least a level where the speaker 11 does not exhibit non-linear distortion. Herein, the output level is configured to be the level at the upper boundary of the region wherein the speaker 11 does not exhibit non-linear distortion. In so doing, the bass signal is maximally boosted while the output level exists in the region where non-linear distortion does not occur.

In addition, as a result of the above configuration, once the output level of the bass signal reaches the boundary level, the primary means of bass enhancement becomes virtual bass enhancement using the output of the harmonic signal.

As a result of a signal processing device configured in accordance with the foregoing embodiment, natural-sounding bass enhancement is conducted by increasing the amount of boost until the level of the input bass signal reaches a set level. When a bass signal at a level greater than the set level is input, bass is continued to be enhanced as a result of bass enhancement using virtual signals. In other words, as a result of the present embodiment, bass enhancement can be conducted wherein the disadvantages of the boost method and the virtual signal enhancement method are mutually compensated for, thereby allowing synergistic advantages to be obtained.

In addition, in the present embodiment, the threshold value th1 whereby harmonic signal output is commenced is configured to be a value smaller than the threshold value th-r. In so doing, the output level of the harmonic signal is made to gradually rise at a time when the input level of the bass signal is still lower than the level at which the output level of the bass signal is controlled to a fixed level. In other words, a region is provided wherein bass boost and harmonic signal output are overlapping.

The harmonic signal output is made to overlap with the bass boost for the following reason. In order to avoid non-linear distortion, the amount of bass signal boost is gradually reduced as the input level of the bass signal approaches the threshold value th-r. Making the harmonic signal output overlap with the bass boost compensates for this reduction in the amount of boost. In other words, by making the harmonic signal output overlap with the bass boost at the portion where the amount of boost is reduced as the input level approaches the threshold value th-r, the insufficient degree of bass enhancement at that portion is effectively compensated for.

However, if no special considerations regarding this point are to be made, then the harmonic signal output may also be made to not overlap with the bass boost by setting the threshold value th1 equal to the threshold value th-r.

In addition, the output level of the harmonic signal is configured to be a fixed level in the region where the input level of the bass signal is greater than the threshold value th2. The output level of the harmonic signal is configured in this way in order to prevent the harmonic signal from exceeding a set level, which can possibly lead to degraded sound quality.

In the case of the present example, this set level of the harmonic signal is configured to be a level near the upper boundary of the region wherein sound quality is not degraded. If the harmonic signal level nears the boundary level in this way, the subjective feeling of enhanced bass can be sufficiently achieved, even if the harmonic signal level is relatively lower than the signal levels of other bands. In other words, there is almost no concern that the lack of bass frequencies will be perceived.

The description herein will now return to discussion of FIG. 2.

The DSP 7 conducts digital signal processing so as to realize the function of the bass enhancement processor 7a described above, while in addition conducting digital signal processing so as to realize the function of a speaker compensation filter processor 7b.

The speaker compensation filter processor 7b takes the second combined signal, which was obtained as a result of the addition operation conducted by the adder 16, and conducts filter processing that applies signal characteristics to the second combined signal, the applied signal characteristics corresponding to the inverse characteristics of the characteristics of the speaker 11 (i.e., the speaker characteristics).

The application of the inverse characteristics of speaker characteristics, and the advantages obtained thereby, will now be described with reference to FIG. 8.

First, when typically reproducing sound from an audio signal using a speaker, the speaker possesses unique characteristics, such as frequency characteristics and time response characteristics. For this reason, even given the same input audio signal, reproduced sound is output that sounds different for each speaker. This fact is one of the factors contributing to the existence of a variety of differently nuanced speakers having excellent musical properties.

On the other hand, methods are known wherein the reproduced sound from a speaker is improved by eliminating the speaker's individual nuances. In other words, for a given audio signal input into a given speaker, characteristics are applied to the components of the audio signal that have been calculated in advance to be the inverse of the characteristics of the speaker. In so doing, it is possible to normalize individual speaker characteristics and conduct homogenous sound reproduction.

Figure 8A:
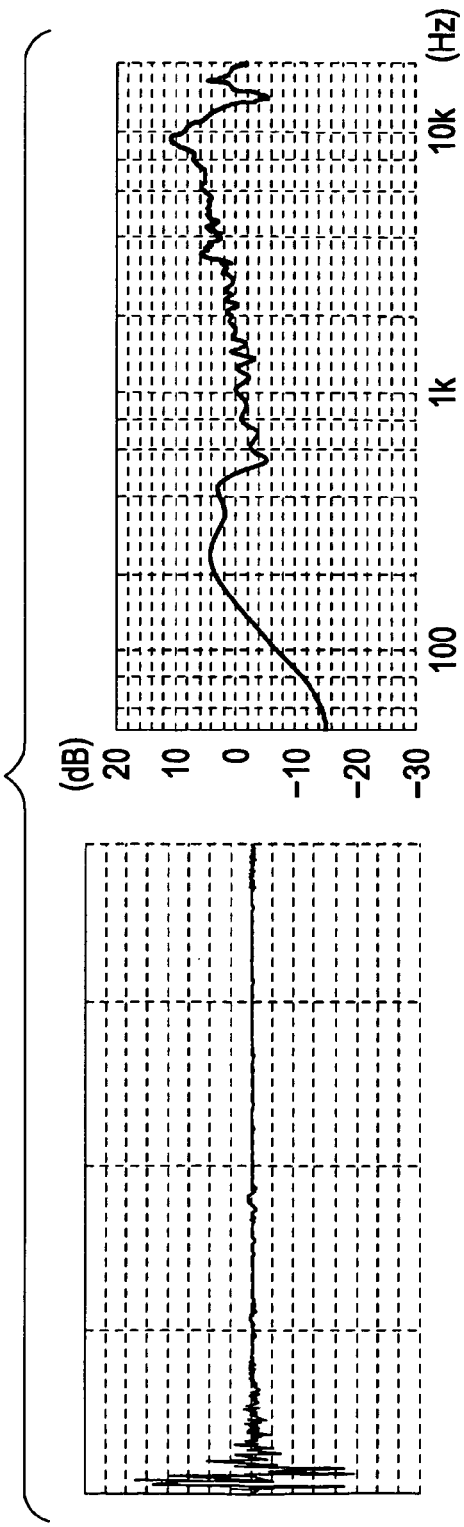
FIG. 8 is a diagram for explaining the inverse characteristics of speaker characteristics.
Figure 8B:
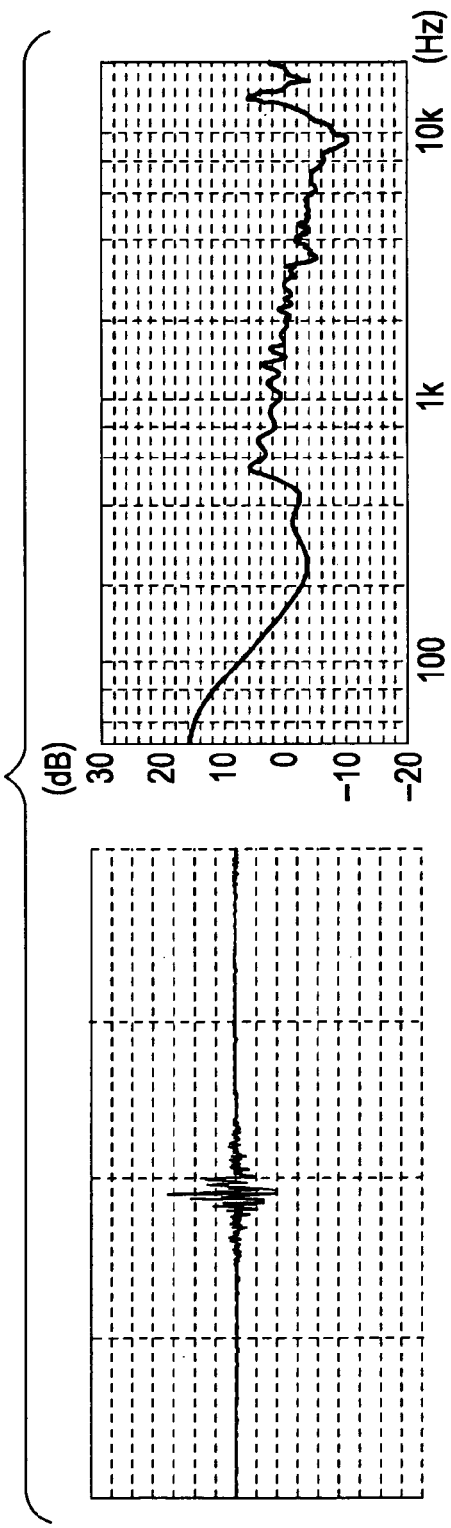

FIG. 8A shows the impulse response and frequency characteristics measured for a specific speaker. FIG. 8B shows impulse response (i.e., time response characteristics) and frequency characteristics that are the inverse of the characteristics of the speaker, the inverse characteristics having been generated on the basis of the measured results shown in FIG. 8A. In either figure, impulse response is shown on the left, while frequency characteristics are shown on the right.

The inverse characteristics of a speaker's characteristics herein refers to the following. If the measured characteristics shown in FIG. 8A (i.e., the impulse response and frequency characteristics) are taken to be a transfer function $H(s)$, then the inverse characteristics become a transfer function expressed as $1/H(s)$. Thus, a transfer function $1/H(s)$, being a set of inverse characteristics (i.e., an inverse function) calculated according to the above, is applied to the components of an audio signal input into a speaker.

By applying such inverse characteristics, the resulting sound reproduced by the speaker has flat frequency characteristics, and the linear-phase characteristics (i.e., the impulse response) thereof exhibit little fluctuation.

The speaker compensation filter processor 7b in FIG. 2 applies signal characteristics that correspond to inverse characteristics like the above. In other words, the speaker compensation filter processor 7b is configured having signal characteristics that correspond to a transfer function ($1/H(s)$) that expresses the inverse of the speaker characteristics (i.e., a function $H(s)$ of frequency characteristics and impulse response) of a speaker 11. The speaker characteristics of the speaker 11 are measured in advance on the basis of a sound played back from a reference signal such as a TSP (time-stretched pulse) signal. The signal characteristics are applied to the second combined signal obtained as a result of the addition operation conducted by the adder 16.

Figure 9:
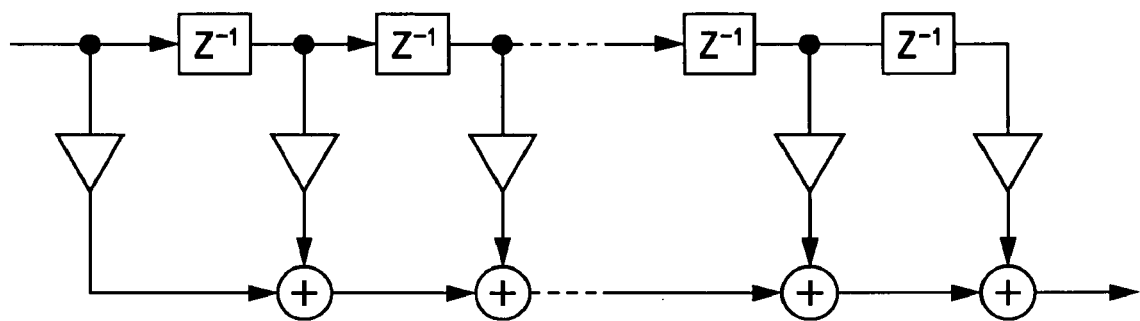
FIG. 9 shows an exemplary configuration of a digital filter for realizing filter processing that applies characteristics that are the inverse of speaker characteristics.

FIG. 9 illustrates an exemplary configuration of a digital filter for realizing the filter processing whereby signal characteristics corresponding to the above inverse characteristics are applied. As shown in FIG. 9, an FIR (Finite Impulse Response) filter is used as the digital filter for applying signal characteristics that are the inverse of the speaker characteristics of the speaker 11, the signal characteristics being applied over a relatively broad frequency spectrum. In other words, the speaker compensation filter processor 7b is realized by conducting digital filter processing on an input signal that realizes the function of an FIR filter like the above, wherein signal characteristics are applied corresponding to the above inverse characteristics.

In the case of the present embodiment herein, the speaker compensation filter processor 7b does not apply the inverse of the measured characteristics of the speaker 11 as-is. Rather, as a technique of accommodating the bass signal boosting described earlier, the inverse of the measured characteristics of the speaker 11 is applied, but wherein the bass component thereof has been boosted in advance.

This point will now be described with reference to FIGS. 10 to 12.

Figure 10A:
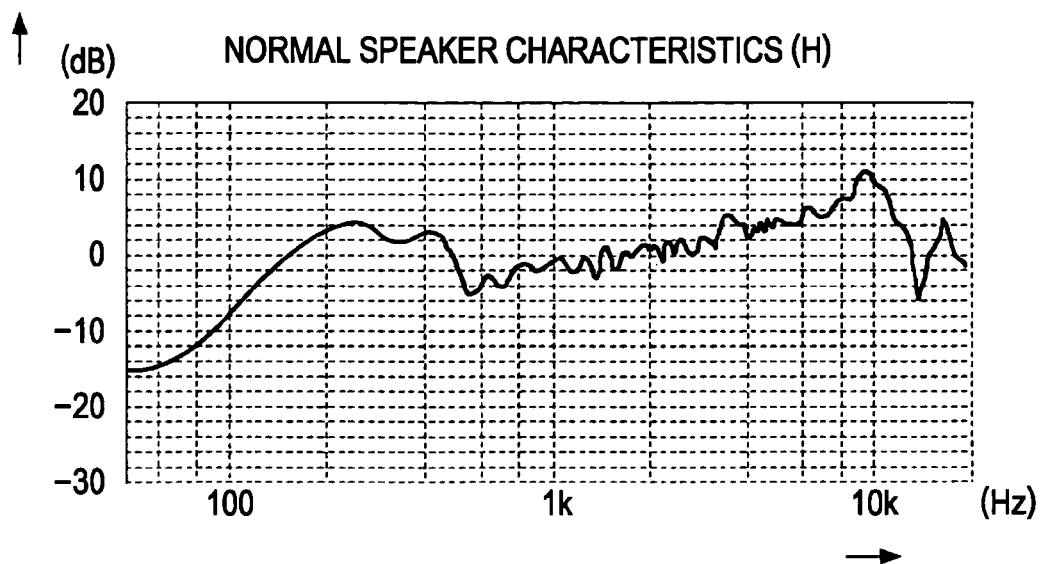
FIG. 10 shows examples of normal speaker characteristics and bass-boosted characteristics.
Figure 10B:
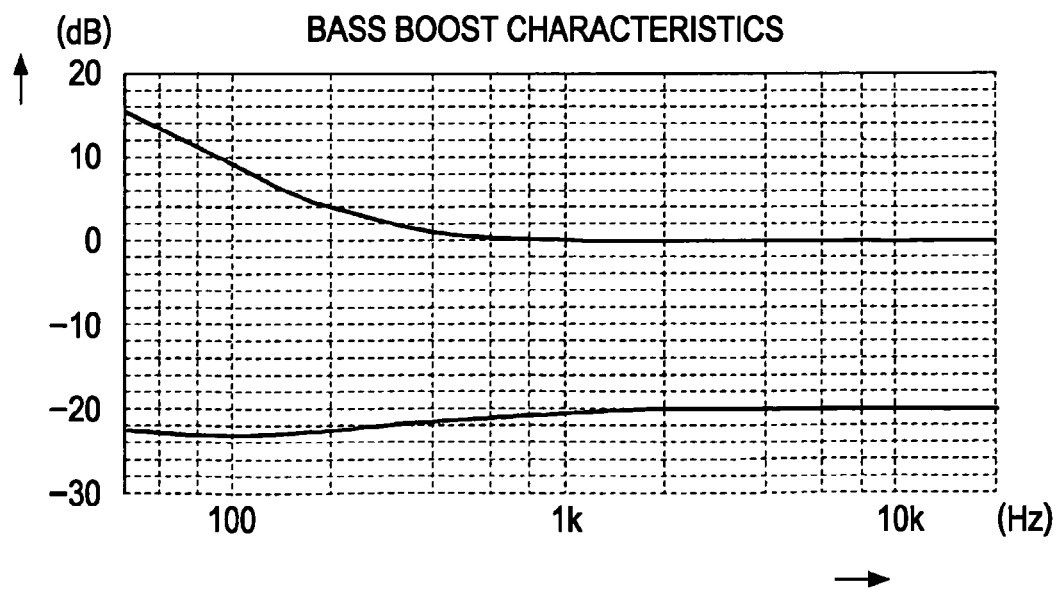

FIG. 10A shows normal speaker characteristics. More specifically, FIG. 10A shows the characteristics (i.e., a transfer function H expressing the frequency-amplitude characteristics) of the speaker 11 as measured when an audio signal (reference signal) is played back normally by the speaker 11 (i.e., the speaker 11 is made to reproduce sound without performing any special signal processing, such as boosting the reference signal).

As described earlier, in order to simply normalize the frequency characteristics, one need only apply to the components of the reference signal the inverse of the transfer function H shown in FIG. 10A. However, in the present embodiment, the characteristics of the speaker 11 are measured by first applying frequency-amplitude characteristics like those shown in FIG. 10B to the reference signal in advance, and subsequently causing the speaker 11 to reproduce sound with the bass signal in a boosted state.

Figure 11:
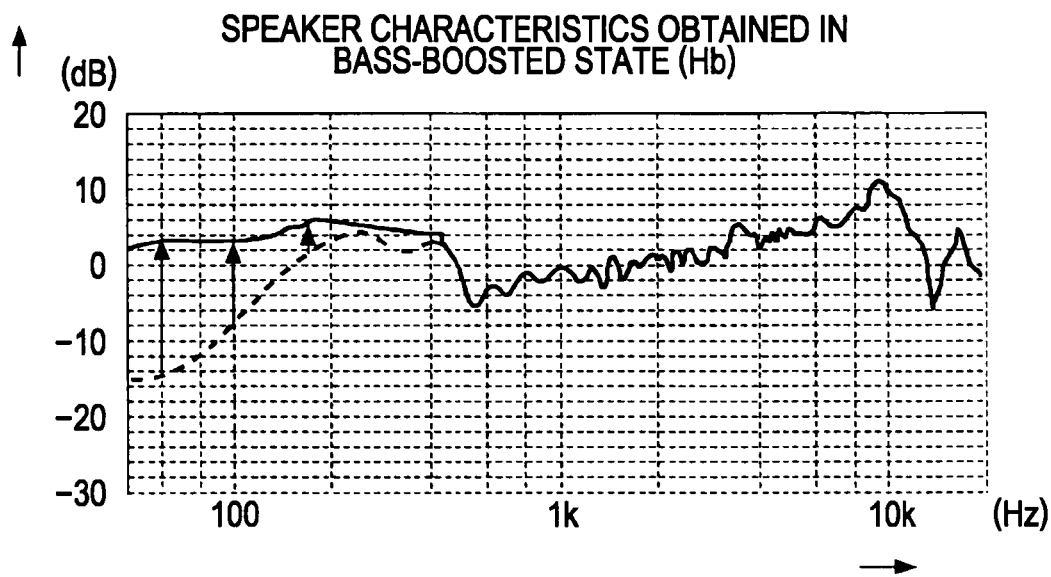
FIG. 11 shows exemplary speaker characteristics obtained in a bass-boosted state.

FIG. 11 shows the frequency-amplitude characteristics (herein taken to be Hb) of the speaker 11 as measured in a bass-boosted state. In this case, it can be seen that boosting the bass results in characteristics wherein the bass component has been raised higher than that of the normal characteristics of the speaker 11 expressed by the transfer function H (indicated by the broken line in the figure).

Subsequently, the transfer function Hb, which expresses characteristics having a raised bass component as shown in FIG. 11, is used to calculate the inverse characteristics thereof. FIG. 12 shows an example of a transfer function 1/Hb that expresses the calculated inverse of the frequency-amplitude characteristics shown in FIG. 11. As shown in FIG. 12, the transfer function 1/Hb expresses inverse characteristics having a bass component whose gain has been lowered compared to the normal inverse characteristics expressed by 1/H (i.e., the inverse characteristics in the case where normal sound reproduction is conducted without boosting the bass; indicated by the broken line in the figure).

By way of example, only frequency-amplitude characteristics are considered herein as the characteristics of the speaker 11, and description of time response characteristics has been omitted. Needless to say, however, time response characteristics may also be measured in the case of a linear phase filter. In such a case, a transfer function Hb(s) is used that expresses both the measured time response characteristics as well as the measured frequency-amplitude characteristics, and the transfer function 1/Hb(s) is calculated as the inverse function thereof. In the present embodiment, a linear phase filter is assumed to be used, and thus the inverse characteristics of the speaker 11 are calculated using a transfer function 1/Hb(s) like the above.

In this way, the speaker compensation filter processor 7b is configured having a calculated transfer function 1/Hb(s) that expresses the inverse characteristics of the speaker 11. Furthermore, as a result of digital signal processing that realizes the function of the FIR filter shown in FIG. 9, the transfer function 1/Hb(s) that expresses the inverse characteristics is applied to the second combined signal.

Figure 12:
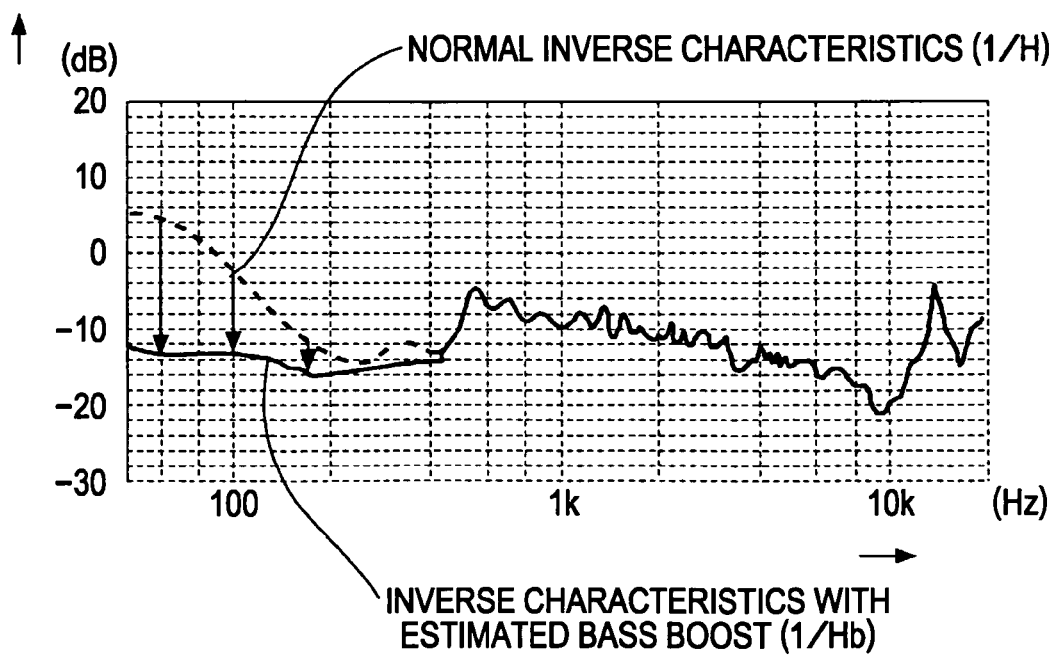
FIG. 12 shows exemplary inverse characteristics in accordance with an embodiment of the present invention.

As can be seen in the comparison shown in FIG. 12, the inverse characteristics 1/H of the speaker 11 (indicated by the broken line in the figure), which were calculated by conducting normal measurement without bass boosting, have a bass component whose gain has been raised to a relatively large degree when compared to the inverse characteristics 1/Hb of the present example (indicated by solid line in the figure). If attempting to normalize frequency characteristics by applying the normal inverse characteristics 1/H to the components of the audio signal, then an FIR filter having a correspondingly long tap length becomes necessary, which leads to increased hardware resources for the DSP 7 or increased processing load as a result.

In consideration of this fact, boosting of the bass signal for normalization in the present example is made to be primarily handled by the bass signal boosting subprocess conducted by the LPF processor 15 and the gain adjustment processor 17 during actual sound reproduction. As described earlier, the characteristics applied by the speaker compensation filter processor 7b are configured to be the inverse of speaker characteristics measured in advance, the speaker characteristics expressing a bass signal that has been boosted with an estimated amount of boost. In other words, as a result of a configuration like the above, it becomes possible to reduce the processing load on the FIR filter (i.e., the speaker compensation filter processor 7b) that accompanies bass enhancement conducted for normalization.

In so doing, the tap length of the FIR filter that acts as the speaker compensation filter processor 7b can be markedly reduced compared to the case wherein the normal inverse characteristics 1/H are applied. Thus, simplifying the gain applied to bass frequencies allows the tap length of the FIR filter to be reduced. Given that relatively few hardware resources need be allocated to the IIR filter for realizing the LPF processor 15, it can be seen that the necessary hardware resources for the DSP 7 can be greatly reduced as a result.

In this way, bass boosting for normalization is made to be primarily handled by the bass signal boosting subprocess conducted by the LPF processor 15 and the gain adjustment processor 17, while the characteristics applied by the speaker compensation filter processor 7b are configured to be inverse characteristics calculated in advance and expressing a bass signal that has been boosted by an estimated amount of boost. As a result of this configuration, the hardware resources of the DSP 7, as well as the processing load thereon, can be greatly reduced.

It should be appreciated that when measuring the characteristics Hb shown in FIG. 11, the band of the audio signal to be boosted is configured to be the same band as that extracted by the LPF processor 15. In addition, the amount of boost (i.e., the gain) in this case is configured such that the output level of the bass signal reaches a level identical the upper boundary level of the region wherein the speaker 11 does not exhibit non-linear distortion, as shown in FIG. 7A. In other words, configuring the amount of boost during measurement to be like the above enables the characteristics of the speaker 11 to be measured at a time when the bass signal has been maximally boosted as a result of the gain control conducted by the gain adjustment control processor 20. Furthermore, the inverse characteristics 1/Hb in this case serve as reference characteristics for the state wherein the bass signal level is maximally boosted as a result of the gain control conducted gain adjustment control processor 20, and thus become the characteristics used to normalize the frequency characteristics.

If the bass boost frequency band and the amount of bass boost during measurement are configured as described above, then the bass signal characteristics are not strictly normalized during actual sound reproduction whenever the input level of the bass signal is a value other than the threshold value th-r described earlier. However, when the original input signal level is relatively low, the effects of normalization are difficult to perceive subjectively. Consequently, even if strict normalization is not conducted for input signal levels lower than the threshold value th-r, perception of the lack of bass frequencies does not pose a problem.

In addition, in the present example, bass enhancement is primarily achieved by harmonic signals when the input signal level becomes greater than the threshold value th-r, as described above. For this reason, the lack of bass frequencies is not subjectively perceived, even if the bass signal characteristics are not strictly normalized (more specifically, the bass signal level is not lowered relative to other mid- and high-frequency signal levels) for input signal levels higher than the threshold value th-r.

In other words, as a result of the above configuration, advantages nearly identical to the case wherein strict normalization is conducted are obtained from a subjective listening standpoint while also allowing for a configuration wherein the normalization-related hardware resources and processing load of the DSP 7 have been reduced.

In the present example, the application of inverse speaker characteristics enables normalization of frequency characteristics and linearization of phase response. Moreover, such normalization of frequency characteristics and linearization of phase response yields not only the advantage of sound reproduction with nearly flat characteristics and reduced influence from the characteristics of the speaker 11, but in addition, bass enhancement using harmonic signals is stably achieved.

Figure 13A:
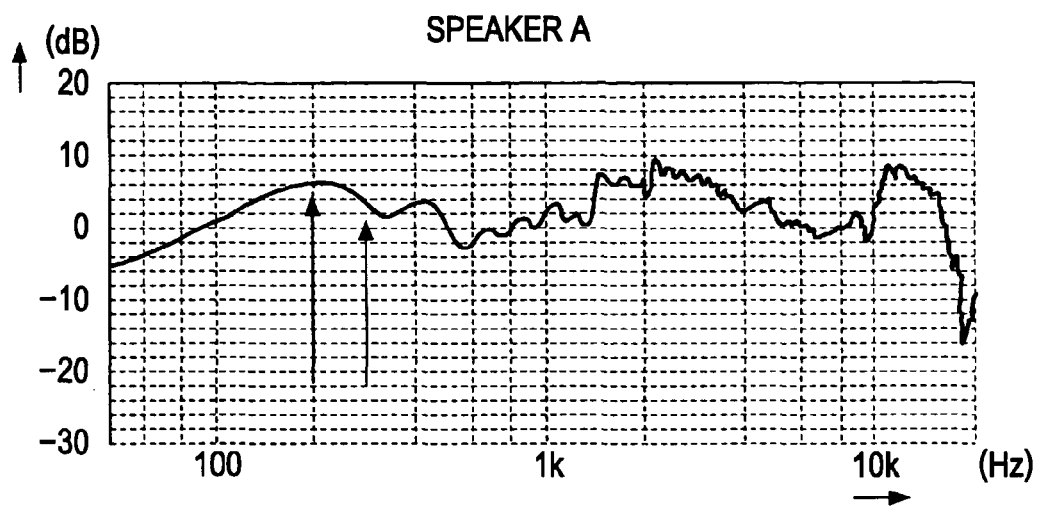
FIG. 13 is a diagram for explaining the influence that speaker characteristics exert on bass enhancement using harmonic signals.
Figure 13B:
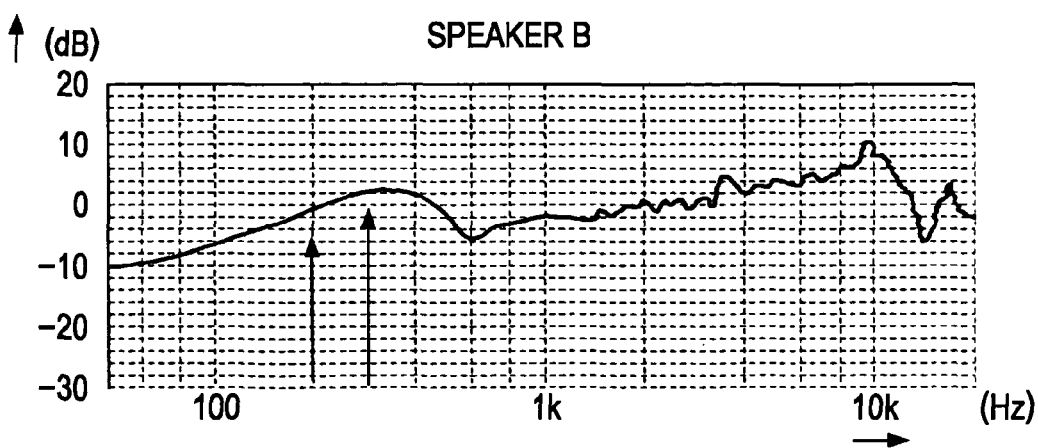

FIGS. 13A and 13B showing the differing frequency characteristics of a speaker A and a speaker B.

As can be inferred from the foregoing description, a harmonic signal is generated as a signal made up of integer multiples of frequencies from a bass signal extracted by the LPF processor 15. In both FIGS. 13A and 13B, the locations of the second harmonic wave (200 Hz) and the third harmonic wave (300 Hz) of a 100 Hz signal are indicated by arrows. However, as can be seen from the comparison of FIGS. 13A and 13B, the playback level of the same harmonic signal is different between speakers having different characteristics. In other words, since the speaker characteristics differ, variations occur in the perceived richness and depth of the bass component resulting from the harmonic signal.

In addition, upon individual examination of the speaker A and the speaker B, it can be seen that differences are also imparted to the playback levels of the second harmonic wave and the third harmonic wave with respect to each other. In the example shown in the figure, the difference in signal level between the second harmonic wave and the third harmonic wave is approximately 5 dB for both the speaker A and the speaker B. These differences contribute to degraded sound quality in the virtually perceived bass component.

Moreover, similar differences in playback level occur not only between second and third harmonic waves based on the same frequency signal, but also between harmonic waves based on signals of different frequency. For example, comparison of a second harmonic wave (200 Hz) based on a 100 Hz signal to a second harmonic wave (120 Hz) based on a 60 Hz signal would yield a difference relative to the playback levels of the two waves. As a result, a level is also subjectively perceived as a relative difference between 60 Hz and 100 Hz.

Thus, the richness and quality of the perceived bass component as a result of adding harmonic signals are dependent on the characteristics of the speaker.

Furthermore, although omitted from the above description, the phase relationship of harmonic waves actually played back using a speaker varies due to the frequency response, with respect to those harmonic waves, of the speaker being used. In other words, the richness and quality of the perceived bass component is also dependent on the phase characteristics of the speaker.

In order to counter such problems, the present embodiment allows for normalization of frequency characteristics and linearization of phase response at middle to high frequencies. In other words, normalization of frequency characteristics and linearization of phase response can be conducted with respect to frequency bands that contain harmonic signal generated on the basis of the bass signal.

As a result, degraded richness and quality of the bass due to the influence of speaker characteristics like those described above is prevented, and bass enhancement using virtual signals is stably achieved.

If the only concern is to stabilize subjective bass enhancement using virtual signals, then normalization of frequency characteristics and linearization of phase response may be limited to only those frequency bands containing the harmonic signal. In other words, if for example a harmonic signal is generated having harmonic waves up to the third harmonic as in the present embodiment, then normalization of frequency characteristics and linearization of phase response need only be carried out within the region [f0<f<(f0×3)], wherein f0 is the upper-bound frequency of the bass signal (i.e., the lower-bound frequency of the band for which the speaker 11 is capable of sufficient sound reproduction). More specifically, among the full range of inverse characteristics given by 1/Hb(s), the speaker compensation filter processor 7b need only be configured with the characteristics of the frequency band expressed by [f0<f<(f0×3)], these characteristics subsequently being applied to the input signal.

As a result of such a configuration, favorable bass playback that does not exhibit variations in the bass enhancement by virtual signals is realized, while additionally leaving unmodified the original speaker characteristics at middle to high frequencies.

Second Embodiment

A second embodiment will now be described.

FIG. 14 is a diagram for explaining the configuration of a signal processing device in accordance with the second embodiment of the present invention. In the second embodiment, operations related to the audio signal processing of the first embodiment described in the foregoing are realized by the processing operations of a CPU (Central Processing Unit).

FIG. 14 illustrates the internal configuration of electronic equipment having a signal processing device provided by such a CPU. This electronic equipment is assumed to be a personal computer, for example.

As shown in FIG. 14, first an audio signal (digital audio signal) is played back from a recording medium (not shown in the drawings) and supplied to a CPU 25.

The CPU 25 is provided with memory 26, the CPU 25 being able to read data therefrom and write data thereto. The memory 26 is used by the CPU 25 as a work area, while also storing information such as parameters necessary during various processing conducted by the CPU 25. In the particular case of the present embodiment, the memory 26 stores an audio processing program 26a that causes the CPU 25 to execute audio signal processing equivalent to the embodiment shown in FIG. 15, to be described hereinafter.

Having been subject to audio signal processing by the CPU 25, the audio signal is then supplied to a DAC 9 and converted into an analog signal. Subsequently, the converted analog signal is amplified at an amp 10 and then supplied to a speaker 11, thereby driving the speaker 11.

Figure 15:
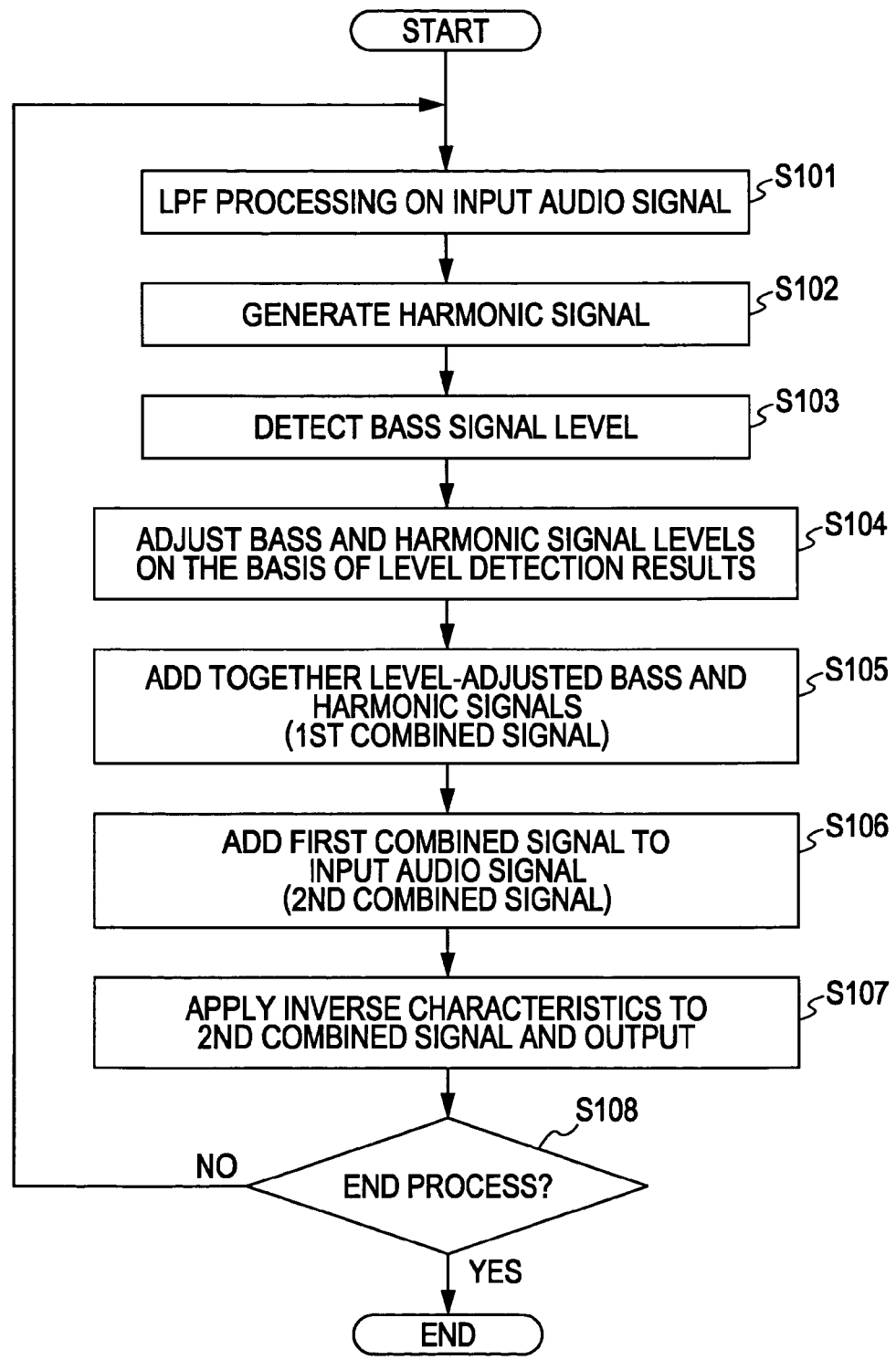
FIG. 15 is a flowchart illustrating the processing operations conducted in order to realize the audio signal processing operations in accordance with an embodiment of the present invention.

The flowchart in FIG. 15 shows the processing operations conducted when an audio signal is input into the CPU 25.

It should be appreciated that, in this case, the CPU 25 treats the input signal as a series of predetermined frame units. In other words, each processing step S101 to S107 that handles the audio signal is conducted with respect to all frames in the audio signal.

First, the input audio signal is subject to LPF processing in step S101. In other words, the input audio signal is subject to filter processing using filter characteristics similar to those of the LPF processor 15 described earlier. As a result, a bass signal is extracted.

In the subsequent step S102, a harmonic signal is generated. In other words, a harmonic signal is generated from the bass signal extracted as a result of the processing in step S101, the harmonic signal generation conducted using a technique similar to that described earlier with reference to FIG. 5, for example.

In the subsequent step S103, the bass signal level is detected. In the subsequent step S104, the levels of both the bass signal and harmonic signal are adjusted on the basis of the level detection results. In other words, the bass signal level and the harmonic signal level are adjusted on the basis of the input/output level characteristics described earlier with reference to FIGS. 7A and 7B.

In the subsequent step S105, the level-adjusted bass signal and harmonic signal are added together, thereby generating a first combined signal. In the subsequent step S106, the first combined signal is added to the input audio signal, thereby generating the second combined signal.

In the subsequent step S107, inverse characteristics are applied to the second combined signal. More specifically, The second combined signal is subject to digital filter processing via the FIR filter described earlier, such that the inverse characteristics given by 1/Hb(s) are applied thereto. The results are then output to the DAC 9.

In the subsequent step S108, it is determined whether or not the process should be terminated. For example, it is determined whether or not a preconfigured trigger for terminating processing has occurred. The trigger may be operational input that issues a command to terminate playback of the audio signal, for example. If a negative result is obtained in step S108, thus indicating that processing should not be terminated, then the process returns to step S101. If a positive result is obtained indicating that processing should be ended, then the processing operations illustrated in FIG. 15 are terminated.

Third Embodiment

Figure 16:
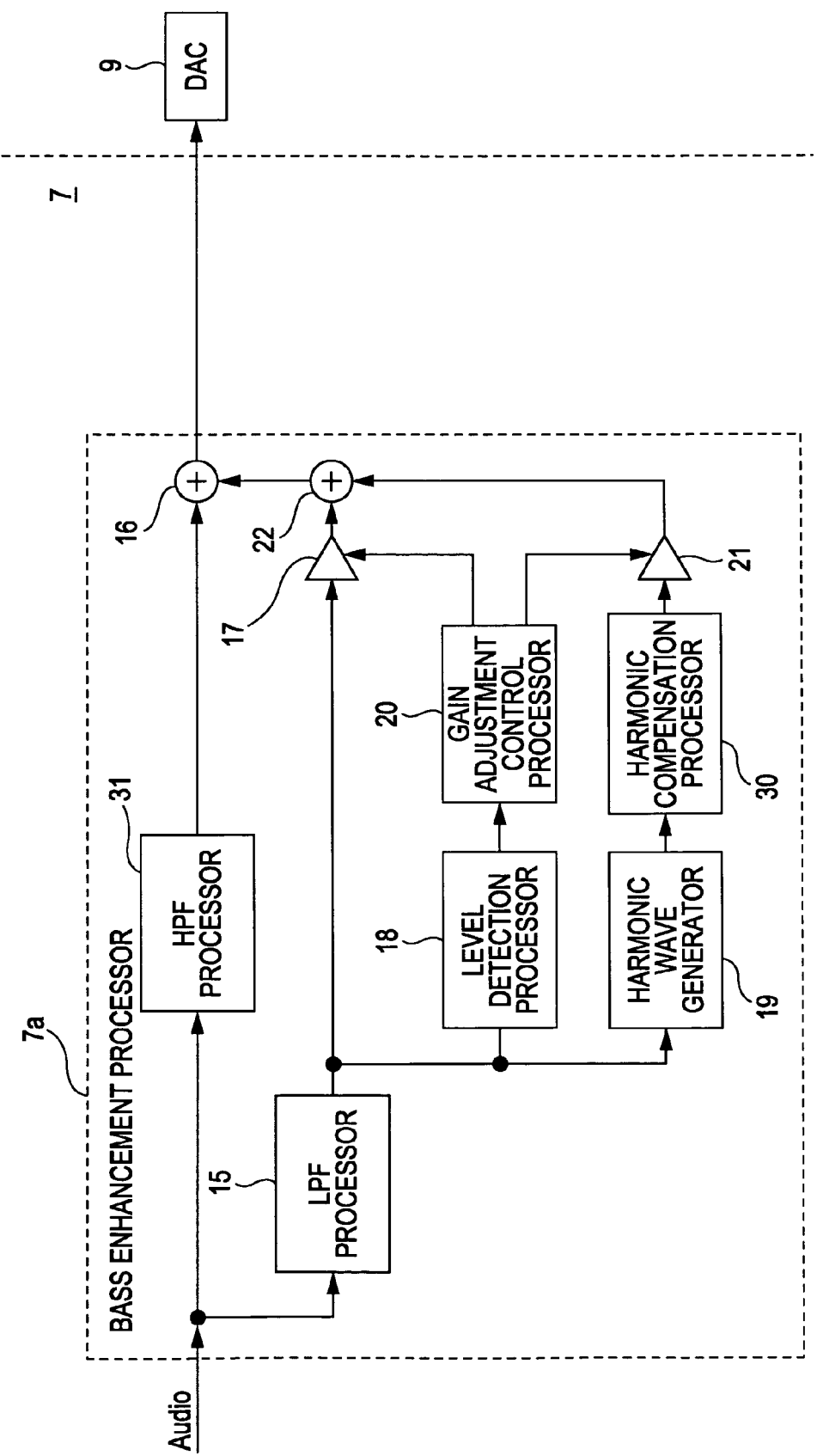
FIG. 16 is a block diagram primarily illustrating the processing functions realized by a DSP provided in a television set in accordance with the third embodiment.

FIG. 16 is a diagram for explaining the configuration of a television set in accordance with the third embodiment of the present invention. The configuration of the television set in accordance with the third embodiment is identical to that of the television set 1 in accordance with the first embodiment, being different only in that the processing conducted by the DSP 7 differs. For this reason, FIG. 16 primarily illustrates only the functional processing blocks realized by the DSP 7 in this case (the DAC 9 external to the DSP 7 in this case is also shown).

Furthermore, it should be appreciated that in the television set in accordance with the third embodiment, the content of the audio processing program 8a stored in the memory 8 has been modified such that digital signal processing for realizing each processing function shown in FIG. 16 is executed by the DSP 7.

Since some functional processing blocks shown in FIG. 16 have already been described with reference to FIG. 2, identical reference numbers have been used for those portions, and further description thereof will be omitted for the sake of brevity.

As shown in FIG. 16, in addition to the functional processing blocks of the DSP 7 in accordance with the first embodiment, the DSP 7 in accordance with the third embodiment includes a harmonic compensation processor 30 disposed between the harmonic wave generator 19 and the gain adjustment processor 21, as well as a HPF (High Pass Filter) process 31 disposed between adder 16 and the split junction of the audio signal that leads to the LPF processor 15. Additionally, the speaker compensation filter processor 7b that was provided in the DSP 7 in accordance with the first embodiment has been omitted.

The HPF processor 31 is configured having a cutoff frequency identical to the cutoff frequency of the LPF processor 15. In so doing, the HPF processor 31 is made to extract all bands of an input audio signal except those of the bass signal. In other words, a mid- to high-frequency signal that the speaker 11 can capably reproduce as sound is extracted.

In addition, the harmonic compensation processor 30 subjects the harmonic signal generated by the harmonic wave generator 19 to filter processing that applies predetermined signal characteristics thereto. Unlike the foregoing embodiments, wherein normalization of frequency characteristics and linearization of phase response was conducted over all frequency bands, it is not necessary for the harmonic compensation processor 30 to apply these signal characteristics to all frequency bands. Rather, the application of signal characteristics is conducted so as to normalize frequency characteristics and linearize phase response for at least the bands to which harmonic waves were added.

Figure 17:
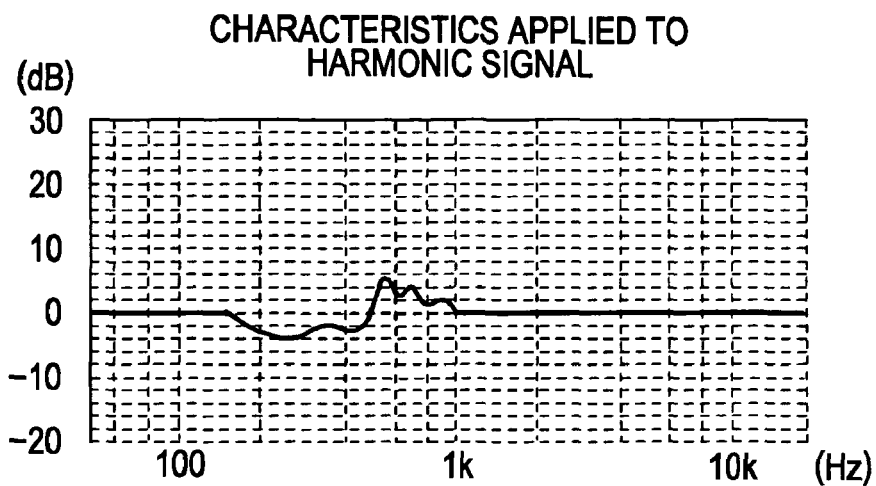
FIG. 17 shows exemplary characteristics applied to a harmonic signal in accordance with the third embodiment.

FIG. 17 is a diagram for explaining the characteristics configured in the harmonic compensation processor 30.

First, the configuration of characteristics for normalization of frequency characteristics and linearization of phase response is conducted similarly to that described with reference to FIG. 8. More specifically, the impulse response and frequency characteristics of a sound played back by the speaker 11 are measured, and the inverse characteristics thereof are then calculated. However, since in this case the characteristics are ultimately applied to bands with harmonic waves added thereto, it is not necessary to boost the bass frequencies as shown in FIG. 10 when measuring.

Thus, the harmonic compensation processor 30 is configured having only the characteristics for at least one portion of the frequency bands in the calculated inverse characteristics.

FIG. 17 shows the extracted characteristics for only one portion of the frequency bands in the calculated inverse characteristics. In the example shown in FIG. 17, the characteristics for the band containing the second through the thirteenth harmonics of a 75 Hz signal (i.e., the 150 Hz to 1 kHz band) have been extracted. Since the harmonic signal generated in the present embodiment only contains harmonic waves up to the third harmonic, the harmonic compensation processor 30 need only be configured with the inverse characteristics for the band given by [f0<f<(f0×3)], wherein f0 is the upper-bound frequency of the bass signal.

Figure 18:
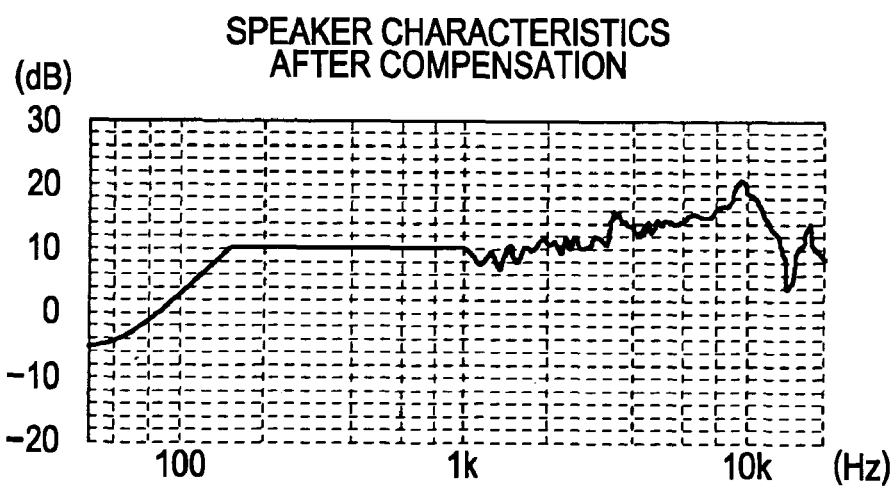
FIG. 18 shows exemplary speaker characteristics in the case where the characteristics shown in FIG. 17 have been applied thereto.

In this way, by configuring the harmonic compensation processor 30 with the characteristics for only a portion of the frequency bands in the inverse characteristics, the characteristics of the speaker 11 in this case are compensated for as shown in FIG. 18, wherein only those speaker characteristics related to harmonic signal generation are compensated for. In other words, only the frequency bands to which inverse characteristics were applied are normalized.

It should be appreciated that the compensation in this case is only conducted with respect to the harmonic signal generated by the harmonic wave generator 19. Thus, in this case the bass signal extracted by the LPF processor 15 and the mid- to high-frequency signal extracted by the HPF processor 31 are output as-is, without being compensated for the characteristics of the speaker 11 applied to these signals. In other words, in this case, the compensation using inverse characteristics only operates on a separate harmonic signal generated from the audio signal. The input audio signal is thus output with the characteristics of the speaker 11 applied to all of the frequency bands thereof, including the bands to which the harmonic signal was added.

As a result of the above configuration in accordance with the third embodiment, the following advantages are jointly achieved: bass enhancement conducted by adding a harmonic signal is stably achieved without influence from speaker characteristics, and sound reproduction is conducted making use of speaker characteristics.

It should be appreciated that the audio signal processing in accordance with the third embodiment may also be realized by the processing operations of a CPU similar to that of the second embodiment. In such a case, the processing operations conducted by the CPU are similar to the series of processing operations in accordance with the second embodiment and described with reference to FIG. 15, but with the following changes. Processing equivalent to that conducted by the harmonic compensation processor 30 is added after a harmonic signal is generated in step S102, but before the processing of step S104. In addition, in step S104, processing is conducted to adjust the levels of the bass signal and the harmonic signal with characteristics applied thereto as above. Furthermore, the input audio signal is subject to processing equivalent to that of the HPF processor 31 before the processing of step S106, while in step S106, processing is conducted to add the audio signal filtered using HPF processing to the first combined signal. Needless to say, the processing of step S107 is not conducted in this case.

Furthermore, it should be appreciated that while the third embodiment was described above as including HPF processing, similar advantages may be obtained without the use of HPF processing.

Fourth Embodiment

Figure 19:
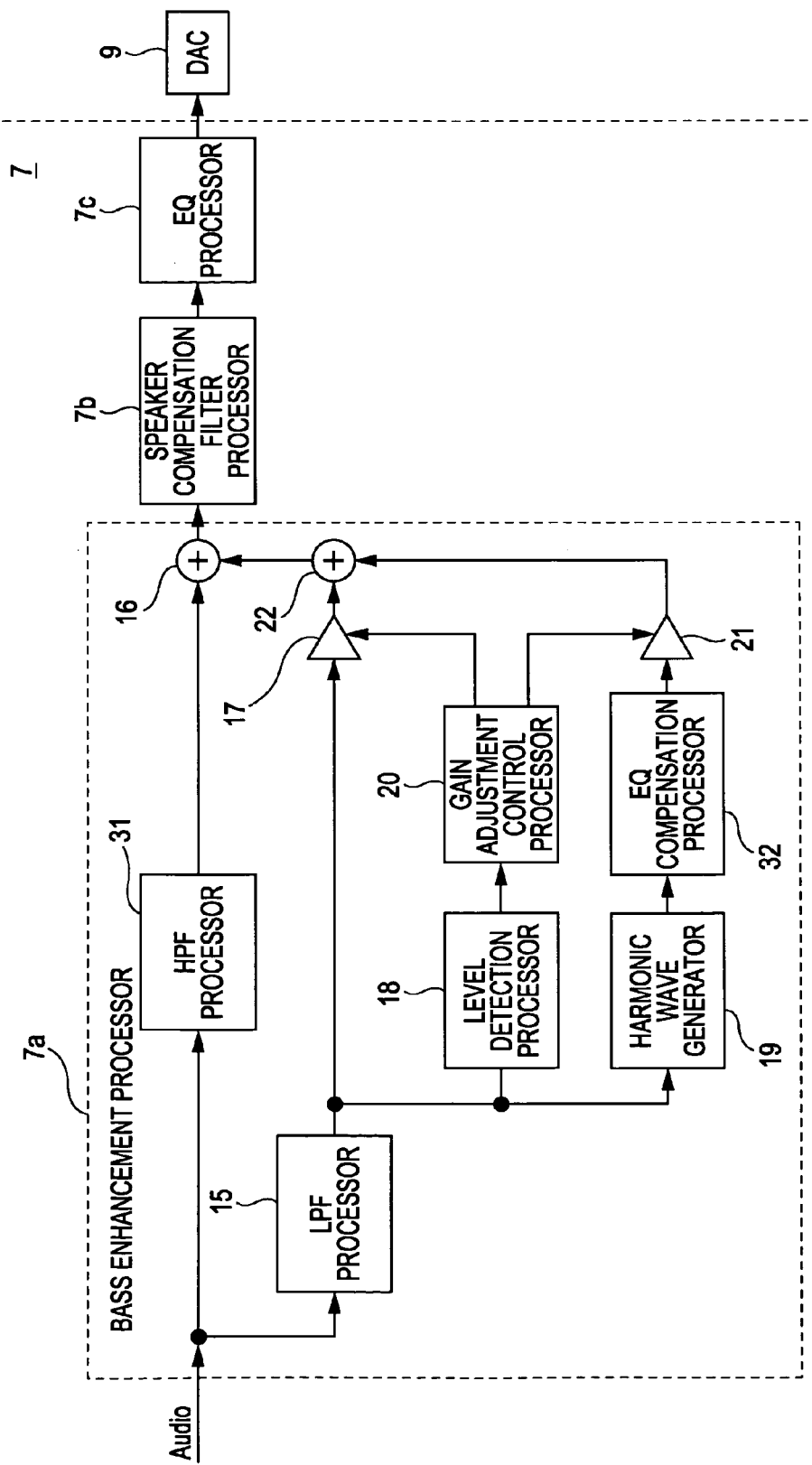
FIG. 19 is a block diagram primarily illustrating the processing functions realized by a DSP provided in a television set in accordance with the fourth embodiment.

FIG. 19 is a diagram for explaining the configuration of a signal processing device in accordance with the fourth embodiment. The configuration of the television set in accordance with the fourth embodiment is also similar to that of the television set 1 in accordance with the first embodiment, being different only in that the processing conducted by the DSP 7 differs. For this reason, FIG. 19 primarily illustrates the functional processing blocks realized by the DSP 7 in this case (the DAC 9 is also shown).

Additionally, since some functional processing blocks shown in FIG. 19 have already been described with reference to FIGS. 2 and 16, identical reference numbers have been used for those portions, and further description thereof will be omitted for the sake of brevity.

The DSP 7 in accordance with the fourth embodiment includes the functional processing blocks of the DSP 7 in accordance with the third embodiment, with the additional inclusion of both the speaker compensation filter processor 7b described in the first embodiment, as well as an EQ processor 7c. Furthermore, an EQ compensation processor 32 has been provided in place of the harmonic compensation processor 30 shown in FIG. 16.

Similar to the foregoing embodiments, the speaker compensation filter processor 7b applies the inverse characteristics 1/Hb(s) that were described in the first embodiment to the second combined signal obtained from the adder 16.

In addition, after the speaker compensation filter processor 7b applies characteristics to the second combined signal, the EQ processor 7c subjects the second combined signal to filter processing that applies required EQ target characteristics thereto. After being subject to such filter processing by the EQ processor 7c, the second combined signal is supplied to the DAC 9.

By providing the speaker compensation filter processor 7b and the EQ processor 7c, an audio signal is output whose components (excepting the harmonic signal) have been normalized in frequency and linearized in phase response as a result of compensating for the characteristics of the speaker 11 in a manner similar to that of the first embodiment, and furthermore wherein the audio signal has been processed with required EQ characteristics.

Thus, the fourth embodiment proposes a technique for accommodating EQ processing. In other words, the fourth embodiment prevents the loss of stability in perceived bass enhancement achieved using harmonic signals, such loss being due to EQ processing.

Figure 20A:
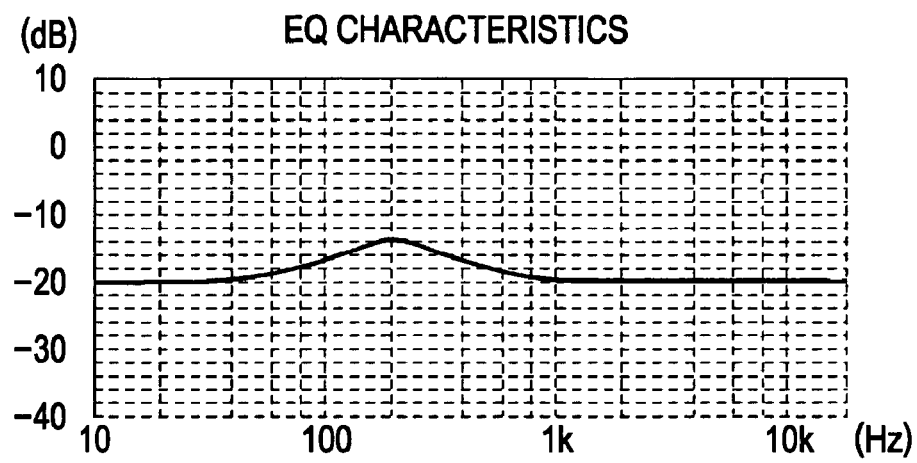
FIG. 20 shows an example of target characteristics, and inverse characteristics thereof, configured for equalization processing conducted in accordance with the fourth embodiment.

For example, consider the case wherein the EQ processor 7c is configured with target characteristics that raise gain for the harmonic frequency band, as shown in FIG. 20A. In this case, even though the speaker compensation filter processor 7b applies inverse characteristics for normalizing the frequency characteristics and linearizing the phase response of the second combined signal obtained from the adder 16, the characteristics for the harmonic frequency band of the second combined signal will still become non-normalized as a result of the subsequent processing by the EQ processor 7c. In other words, a loss of stability will occur in perceived bass enhancement achieved using harmonic signals, the loss being due to the characteristics for the harmonic frequency band becoming non-normalized as described above.

Figure 20B:
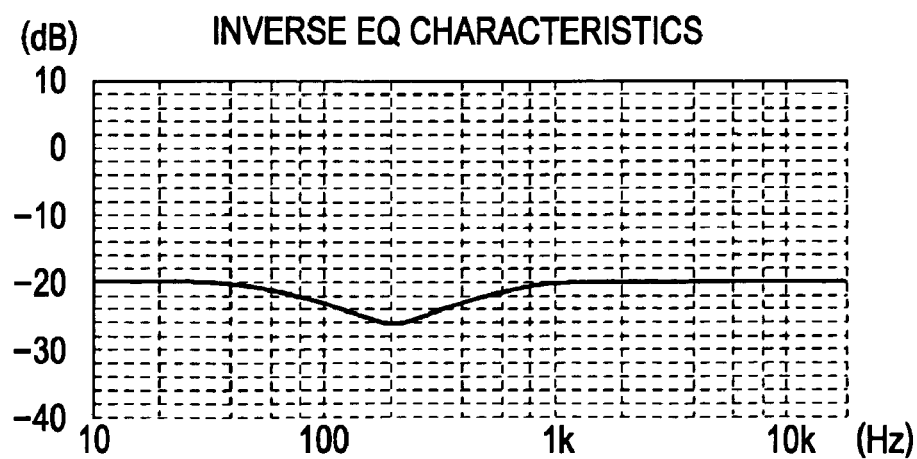

Consequently, an EQ compensation processor 32 is provided in the fourth embodiment. The EQ compensation processor 32 applies signal characteristics to the harmonic signal generated by the harmonic wave generator 19, the signal characteristics being the inverse of the target characteristics configured in the EQ processor 7c. In other words, in the case where the target characteristics illustrated in FIG. 20A are configured, for example, signal characteristics like those shown in FIG. 20B are applied to the harmonic signal.

In this way, by applying characteristics to the harmonic signal that are the inverse of the target characteristics of the EQ processor 7c, the negative influence on the stability of bass enhancement using harmonic signals that is caused by the equalizing of the EQ processor 7c is prevented. As a result, bass enhancement using harmonic signals is stably achieved, even when equalizing is conducted by the EQ processor 7c.

Figure 21A:
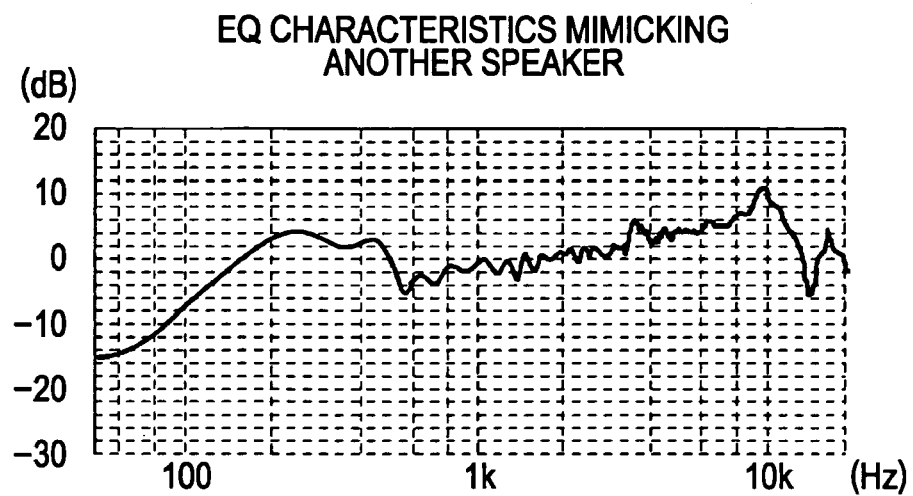
FIG. 21 shows another example of target characteristics, and inverse characteristics thereof, configured for equalization processing conducted in accordance with the fourth embodiment.
Figure 21B:
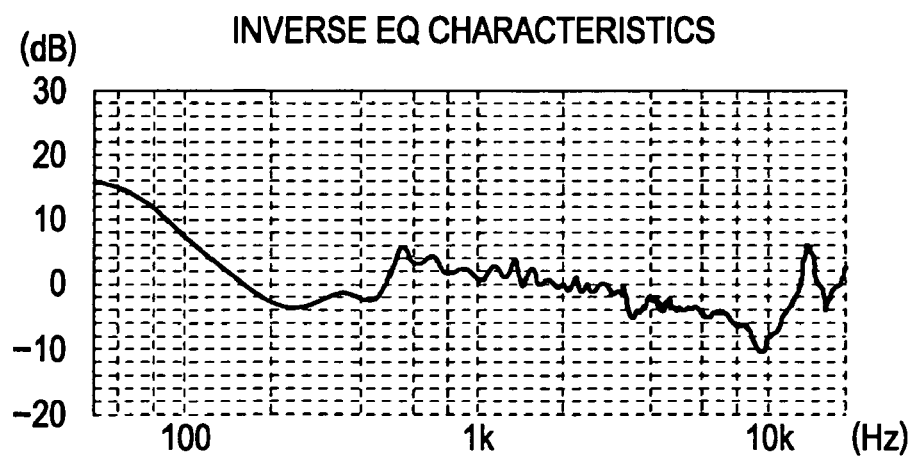

The target characteristics configured in the EQ processor 7c herein are not limited to characteristics that raise gain for only certain bands, as shown by way of example in FIG. 20A. Target characteristics may also be configured to mimic the characteristics of another speaker, as shown in FIG. 21A. For example, if the target characteristics shown in FIG. 21A are configured, then the characteristics configured in the EQ compensation processor 32 become like those shown in FIG. 21B.

The target characteristics configured in the EQ processor 7c may be fixed or variable. If variable, then the target characteristics configured in the EQ processor 7c may be modifiable according to user operations, for example. In this case, the modification of the target characteristics may be achieved by enabling per-band modification of gain for set frequency bands, similar to a graphic equalizer. Alternatively, the target characteristics may be selected from a plurality of characteristics provided as presets.

As a result of the fourth embodiment, an arbitrary equalizer is added to the audio signal processing system, and in addition, bass enhancement using harmonic signals is stably achieved irrespective of the type of equalizer.

It should be appreciated that the audio signal processing in accordance with the fourth embodiment may also be realized by the processing operations of a CPU similar to that of the second embodiment. In such a case, the processing operations conducted by the CPU are similar to the series of processing operations in accordance with the second embodiment and described with reference to FIG. 15, but with the following changes. Processing equivalent to that conducted by the EQ compensation processor 32 is added after a harmonic signal is generated in step S102, but before the processing of step S104. In addition, in step S104, processing is conducted to adjust the levels of the bass signal and the harmonic signal with characteristics applied thereto as above. Furthermore, the input audio signal is subject to processing equivalent to that of the HPF processor 31 before the processing of step S106, while in step S106, processing is conducted to add the audio signal filtered using HPF processing to the first combined signal. In addition, processing equivalent to that of the EQ processor 7c is added between steps S107 and S108.

Furthermore, it should be appreciated that HPF processing may be omitted from the fourth embodiment.

In addition, in the fourth embodiment, the placement of the speaker compensation filter processor 7b and the EQ processor 7c may be reversed. In other words, the order in which the processing to apply characteristics for normalizing frequency and linearizing phase response in the components of the second combined signal obtained from the adder 16 and the equalization processing are conducted may be reversed.

Modifications

While embodiments of the invention have been described in the foregoing, the present invention is not limited to the specific examples described in the foregoing.

For example, for the sake of simplicity in the foregoing description, the audio signal processing of the foregoing embodiments was described, by way of example, as being conducted with respect to an audio signal for a single channel. However, embodiments may be configured to conduct the audio signal processing described above with respect to per-channel audio signals in the case where stereo playback is conducted using an L channel and an R channel, or in the case where multi-channel playback such as 5.1 channel playback is conducted, for example.

Figure 22A:
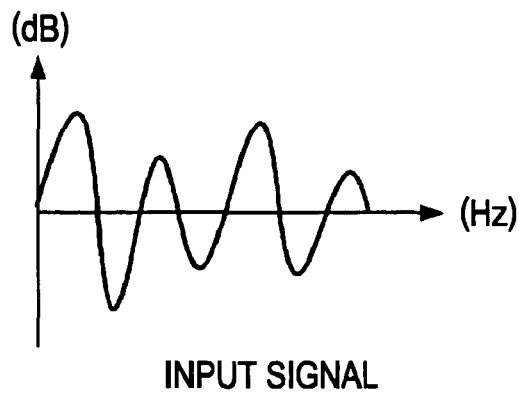
FIG. 22 is a diagram for explaining a modification regarding the technique used to generate a harmonic signal.
Figure 22B:
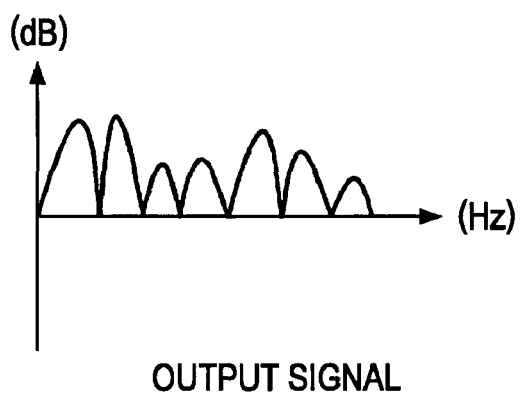

In addition, the harmonic signal may be generated using techniques other than by computation based on the configuration shown in FIG. 5. For example, a technique using the full-wave rectification method may be used, wherein a harmonic signal is generated by taking the absolute value of the input signal, as shown by way of comparison in FIGS. 22A and 22B.

In addition, while the foregoing described examples wherein the audio signal processing functions of the present invention are realized by digital processing using a DSP or CPU, the invention may also be configured such that each processing function is realized using an analog circuit.

In addition, while the foregoing described examples wherein the present invention is applied to a television set, the present invention may be suitably applied to a broad variety of electronic equipment wherein sound reproduction using compact speakers is expected, and thus wherein satisfactory reproduction of bass signals is difficult. For example, the present invention may be suitably applied to active speaker equipment provided with compact speakers, or to a portable video game device.

Figure 24:
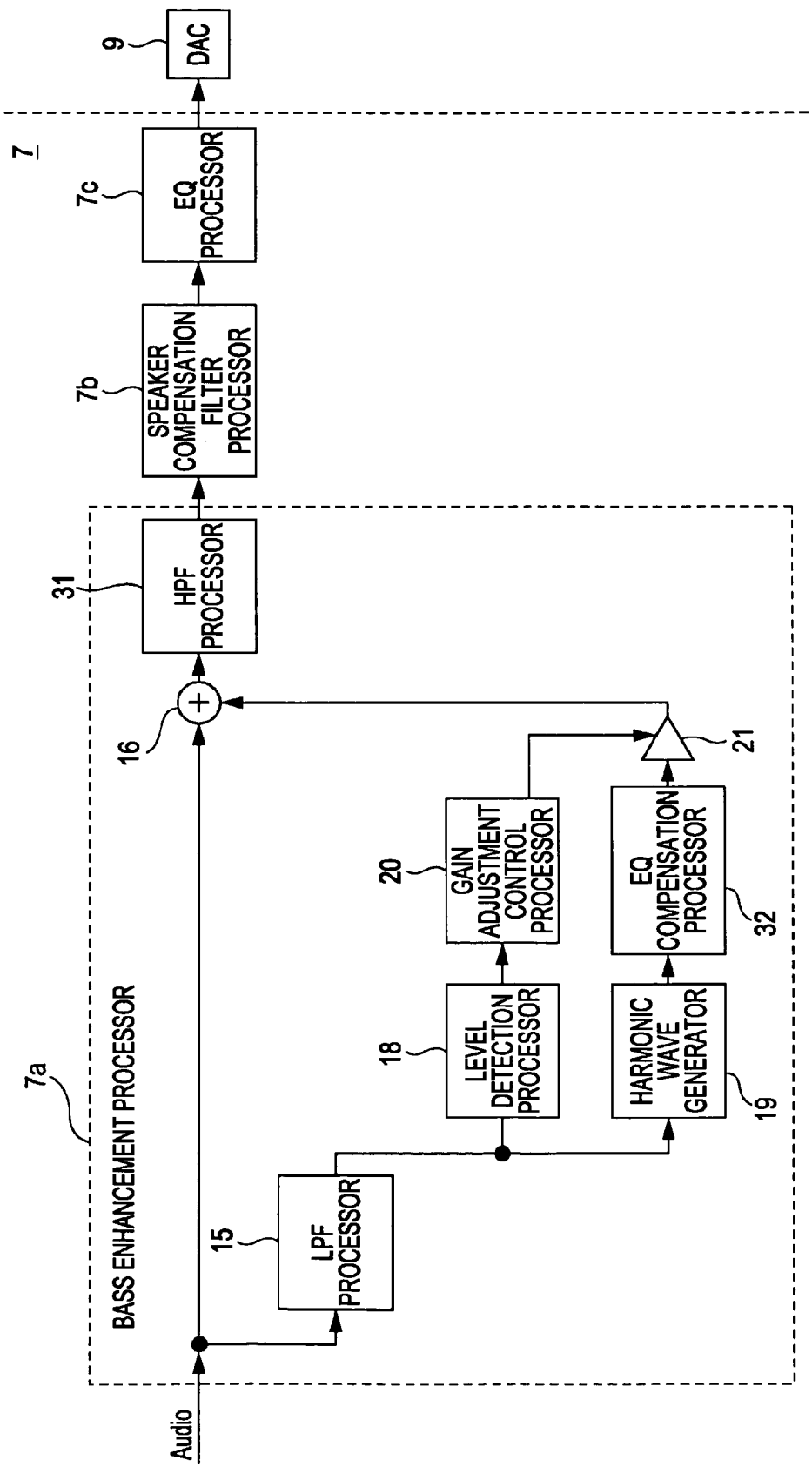
FIG. 24 is an explanatory diagram illustrating the configuration of a modification of the fourth embodiment.
Figure 25A:
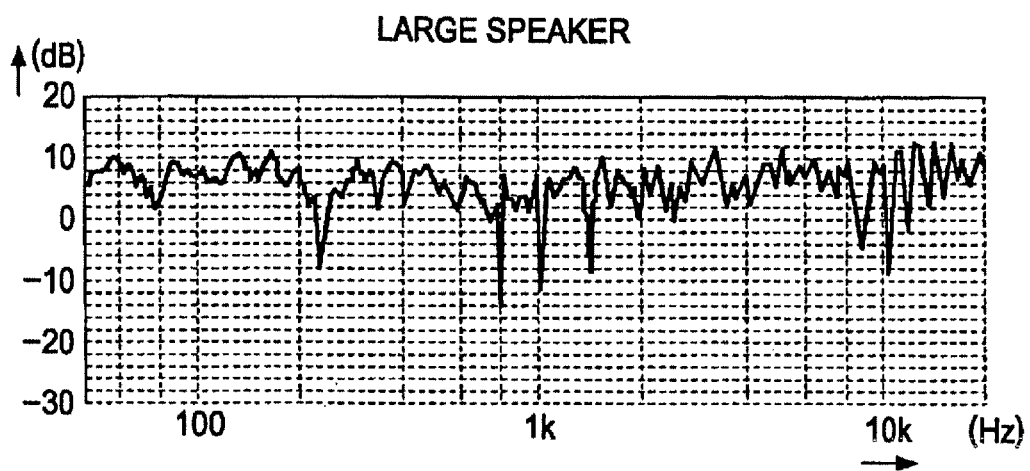
FIG. 25 is a diagram contrasting the sound reproduction characteristics of a large speaker and a small speaker.
Figure 25B:
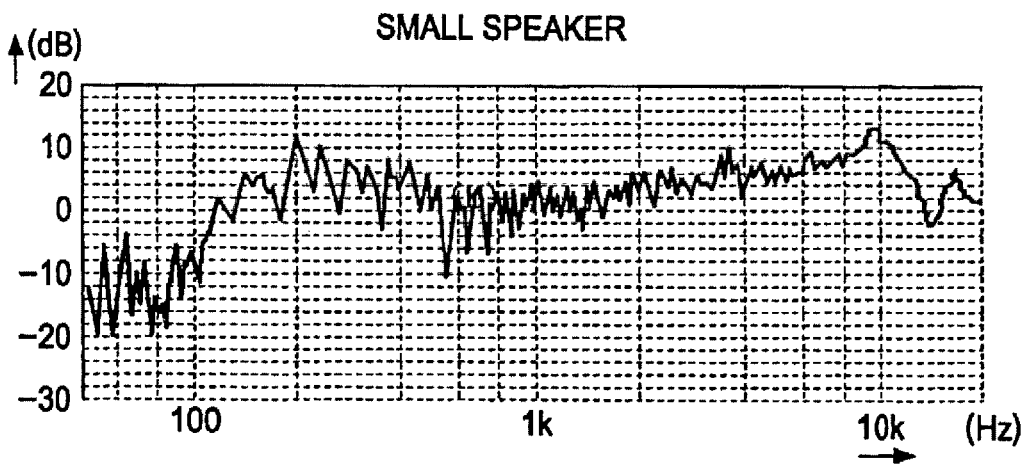

In addition, although departing from the scope of the invention, the audio signal processing system described by way of example in the third and fourth embodiments in particular may also be configured to enhance bass using harmonic signals only, without conducting enhancement by boosting the bass signal. Exemplary configurations of the functional processing blocks of the DSP in such a case are illustrated in FIGS. 23 and 24, respectively. In this case, the bass signal level adjustment control subprocess (i.e., the gain control functions conducted with respect to the bass signal using the gain adjustment processor 17 and the gain adjustment control processor 20) and the adder 22 have been removed from the configurations of FIGS. 16 and 19. Thus, the DSP is configured such that the output from the LPF processor 15 is supplied only to the level detection processor 18 and the harmonic wave generator 19, and the output from the gain adjustment processor 21 is added to the audio signal by the adder 16.

When the DSP is configured to enhance bass using only harmonic signals as above, bass signal output becomes unnecessary. For this reason, the HPF processing of the HPF processor 31 may be conducted after the signal has been combined by the adder 16, as shown in FIGS. 23 and 24.

Furthermore, in this case, the gain control characteristics of the gain adjustment control processor 20 are modified such that perceived bass enhancement using harmonic signals is achieved even when the input level (i.e., the detected level) of the bass signal is relatively low. In other words, the gain control characteristics are modified in this case such that a portion is not formed like that shown in FIG. 7B, wherein a harmonic signal is not output when the input level of the bass signal is low.

It should be appreciated that even in this case, required signal characteristics may be independently applied to only the components of the harmonic signal without affecting the components of the input audio signal, being achievable by applying required signal characteristics to the harmonic signal at least before combination with the input audio signal. In so doing, bass enhancement using harmonic signals is stabilized by independently applying inverse characteristics to the harmonic signal only in order to normalize frequency (and linearize phase response), as described in the third and fourth embodiments. Moreover, sound reproduction making use of the original speaker characteristics may be realized, or alternatively, an arbitrary equalizer may be used while also stabilizing bass enhancement using harmonic signals by applying to the harmonic signal component characteristics that are the inverse of the target characteristics of the EQ processor.

Furthermore, the configurations in FIGS. 23 and 24 need not be configured so as to adjust the harmonic signal level strictly according to the bass signal level. In other words, similar advantages are still obtained using a configuration lacking the level detection processor 18, the gain adjustment control processor 20, and the gain adjustment processor 21. However, by providing such means configurable to adjust the harmonic signal level as shown in FIGS. 23 and 24, the characteristics of the output level of the harmonic signal can be made to be arbitrary non-linear characteristics with respect to the input bass signal level.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing device, comprising:
    a bass signal extractor that extracts a low-frequency band signal from an input audio signal;
    a harmonic wave generator that generates a harmonic signal from the low-frequency band signal that was extracted by the bass signal extractor;
    a level detector that detects a level of the low-frequency band signal extracted by the bass signal extractor;
    an adjustment controller that controls an adjustment of both the level of the low-frequency band signal extracted by the bass signal extractor and the level of the harmonic signal generated by the harmonic wave generator, the adjustment being conducted according to the level of the low-frequency band signal detected by the level detector; and
    an adder that adds, to the input audio signal, the low-frequency band signal and the harmonic signal that were level-adjusted by the adjustment controller; and
    a first filter that applies set signal characteristics to combined signal components that result from the adder adding together the low-frequency band signal, the harmonic signal, and the input audio signal.

2. The signal processing device according to claim 1, wherein the adjustment controller controls the adjustment of the level of the low-frequency band signal such that an output level of the low-frequency band signal is suppressed to a fixed level, the adjustment being conducted when the level of the low-frequency band signal detected by the level detector becomes greater than a predetermined threshold value.

3. The signal processing device according to claim 1, wherein the adjustment controller controls the adjustment of the level of the harmonic signal such that
- the harmonic signal is not output when the level of the low-frequency band signal detected by the level detector is equal to or less than a predetermined threshold value, and
- an output level of the harmonic signal becomes proportional to the detected level of the low-frequency band signal when the level of the low-frequency band signal becomes greater than the predetermined threshold value.

4. The signal processing device according to claim 1, wherein the adjustment controller
- controls the adjustment of the level of the low-frequency band signal such that an output level of the low-frequency band signal is suppressed to a fixed level, the adjustment being conducted when the level of the low-frequency band signal detected by the level detector becomes greater than a first threshold value, and
- controls the adjustment of the level of the harmonic signal such that
    - the harmonic signal is not output when the level of the low-frequency band signal detected by the level detector is equal to or less than a second threshold value, and
    - an output level of the harmonic signal becomes proportional to the detected level of the low-frequency band signal when the level of the low-frequency band signal becomes greater than the second threshold value.

5. The signal processing device according to claim 1, wherein the first filter applies signal characteristics that are an inverse of characteristics of a speaker that conducts sound reproduction on the basis of an output signal of the signal processing device.

6. The signal processing device according to claim 5, wherein the inverse characteristics are calculated on the basis of speaker characteristics measured by causing the speaker to output a reference signal whose low-frequency band has been boosted in advance, the low-frequency band corresponding to the range of frequencies that are extracted by the bass signal extractor.

7. The signal processing device according to claim 1, further comprising:
- a second filter that applies second signal characteristics to the harmonic signal before the harmonic signal is level-adjusted by the adjustment controller.

8. The signal processing device according to claim 7, wherein the second filter applies the second signal characteristics to the harmonic signal that are an inverse of characteristics of the speaker that conducts sound reproduction on the basis of an output signal of the signal processing device.

9. The signal processing device according to claim 7, wherein the first filter applies the set signal characteristics that are the inverse of the characteristics of the speaker that conducts sound reproduction on the basis of the output signal from the signal processing device;
- wherein the signal processing device further comprises an EQ (equalization) processor that conducts EQ processing to apply required signal characteristics as target characteristics to the combined signal components that result from the adder adding together the low-frequency band signal, the harmonic signal, and the input audio signal; and
- wherein the second filter applies signal characteristics to the harmonic signal that are an inverse of the target characteristics of the EQ processor.

* * * * *